US008015519B2

(12) United States Patent
Matsuda et al.

(10) Patent No.: US 8,015,519 B2
(45) Date of Patent: Sep. 6, 2011

(54) VERIFICATION SUPPORTING APPARATUS, VERIFICATION SUPPORTING METHOD, AND COMPUTER PRODUCT

(75) Inventors: Akio Matsuda, Kawasaki (JP); Ryosuke Oishi, Kawasaki (JP); Koichiro Takayama, Kawasaki (JP); Tsuneo Nakata, Kawasaki (JP); Rafael Kazumiti Morizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 302 days.

(21) Appl. No.: 12/335,105

(22) Filed: Dec. 15, 2008

(65) Prior Publication Data
US 2009/0276740 A1  Nov. 5, 2009

(30) Foreign Application Priority Data

Apr. 30, 2008  (JP) .................. 2008-118249

(51) Int. Cl.
*G06F 17/50* (2006.01)
(52) U.S. Cl. ........ 716/106; 716/101; 716/102; 716/103; 716/104; 716/111; 716/132; 716/136; 703/13; 703/14
(58) Field of Classification Search .................. 716/101, 716/102, 103, 104, 111, 132, 136, 106; 703/13, 703/14
See application file for complete search history.

(56) References Cited

U.S. PATENT DOCUMENTS

| | | | |
|---|---|---|---|
| 6,199,057 B1 * | 3/2001 | Tawel ............................ | 706/30 |
| 6,707,463 B1 * | 3/2004 | Gibson et al. ................. | 345/619 |
| 6,721,937 B2 * | 4/2004 | Chard et al. ................... | 716/102 |
| 6,944,709 B2 * | 9/2005 | Nataraj et al. ................ | 711/108 |
| 7,017,043 B1 * | 3/2006 | Potkonjak ..................... | 713/176 |
| 7,171,323 B2 * | 1/2007 | Shipton et al. ................ | 702/106 |
| 7,246,198 B2 * | 7/2007 | Nataraj et al. ................ | 711/108 |
| 7,266,791 B2 * | 9/2007 | Morishita et al. ............ | 716/104 |
| 7,415,689 B2 * | 8/2008 | Taylor ........................... | 716/101 |
| 7,467,319 B1 * | 12/2008 | Kao et al. ...................... | 713/500 |
| 7,509,599 B1 * | 3/2009 | Koelbl et al. ................. | 716/103 |
| 7,565,631 B1 * | 7/2009 | Banerjee et al. ............. | 716/103 |

(Continued)

FOREIGN PATENT DOCUMENTS

JP   A  2006-190209   7/2006

OTHER PUBLICATIONS

Chen et al.; "Hardware verification using symbolic state transition graphs"; Publication Year: 1993; Computer Design: VLSI in Computers and Processors, 1993. ICCD '93. Proceedings., 1993 IEEE International Conference on;pp. 54-57.*

(Continued)

*Primary Examiner* — Helen Rossoshek
(74) *Attorney, Agent, or Firm* — Greer, Burns & Crain, Ltd

(57) ABSTRACT

In a verification supporting apparatus, a recording unit records a DIRW matrix in which a state transition possibly occurring in a register of a circuit to be verified and information concerning validity of a path corresponding to the state transition are set and an acquiring unit acquires a control data flow graph that includes a control flow graph having a data flow graph written therein. When a register is designated for verification, a data flow graph having described therein the designated register is extracted from the control data flow graph. From the data flow graph extracted, a path indicating the flow of data concerning the register is extracted. The state transition of the path extracted is identified and if the state transition is determined to be is set in the DIRW matrix, information concerning the validity set in the DIRW matrix and the path are correlated, and output.

12 Claims, 34 Drawing Sheets

U.S. PATENT DOCUMENTS

| | | | | |
|---|---|---|---|---|
| 7,761,643 | B1* | 7/2010 | Yin et al. | 710/306 |
| 7,822,591 | B2* | 10/2010 | Otsuki et al. | 703/14 |
| 2005/0141565 | A1* | 6/2005 | Forest et al. | 370/503 |
| 2006/0200720 | A1* | 9/2006 | Grimme et al. | 714/738 |
| 2007/0089002 | A1* | 4/2007 | Robertson | 714/726 |
| 2008/0098336 | A1* | 4/2008 | Tanimoto et al. | 716/3 |
| 2009/0179921 | A1* | 7/2009 | Raghavan et al. | 345/689 |
| 2009/0287965 | A1* | 11/2009 | Oishi et al. | 714/45 |
| 2009/0319245 | A1* | 12/2009 | Ivchenko et al. | 703/13 |

OTHER PUBLICATIONS

Saha et al.; "Using formal techniques for identifying uninitialized registers in SoC designs"; Publication Year: 2002; SIC/SOC Conference, 2002. 15th Annual IEEE International; pp. 59-62.*

Hosseinabady et al.; "Low overhead DFT using CDFG by modifying controller"; Publication Year: 2007; Computers & Digital Techniques, IET; vol. 1 , Issue: 4; pp. 322-333.*

Tsung-Yi et al.; "Register minimization beyond sharing among variables"; Publication Year: 1996; Computer-Aided Design of Integrated Circuits and Systems, IEEE Transactions on; vol. 15 , Issue: 12; pp. 1583-1587.*

Leveugle et al.; "A synthesis tool for fault-tolerant finite state machines"; Publication Year: 1993; Fault-Tolerant Computing, 1993. FTCS-23. Digest of Papers., The Twenty-Third International Symposium on; pp. 502-511.*

Yusuke Matsunaga, "Basic techniques for high-level synthesis," Proceedings of the Society Conference of IEICE, Sep. 2003.

* cited by examiner

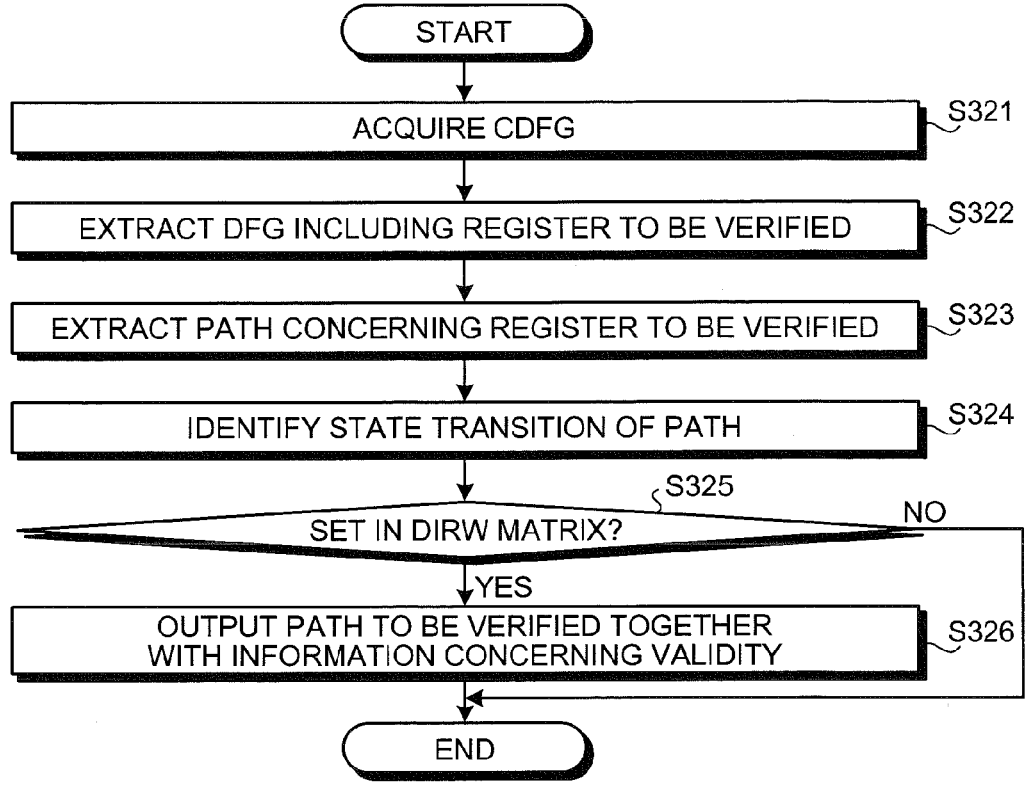
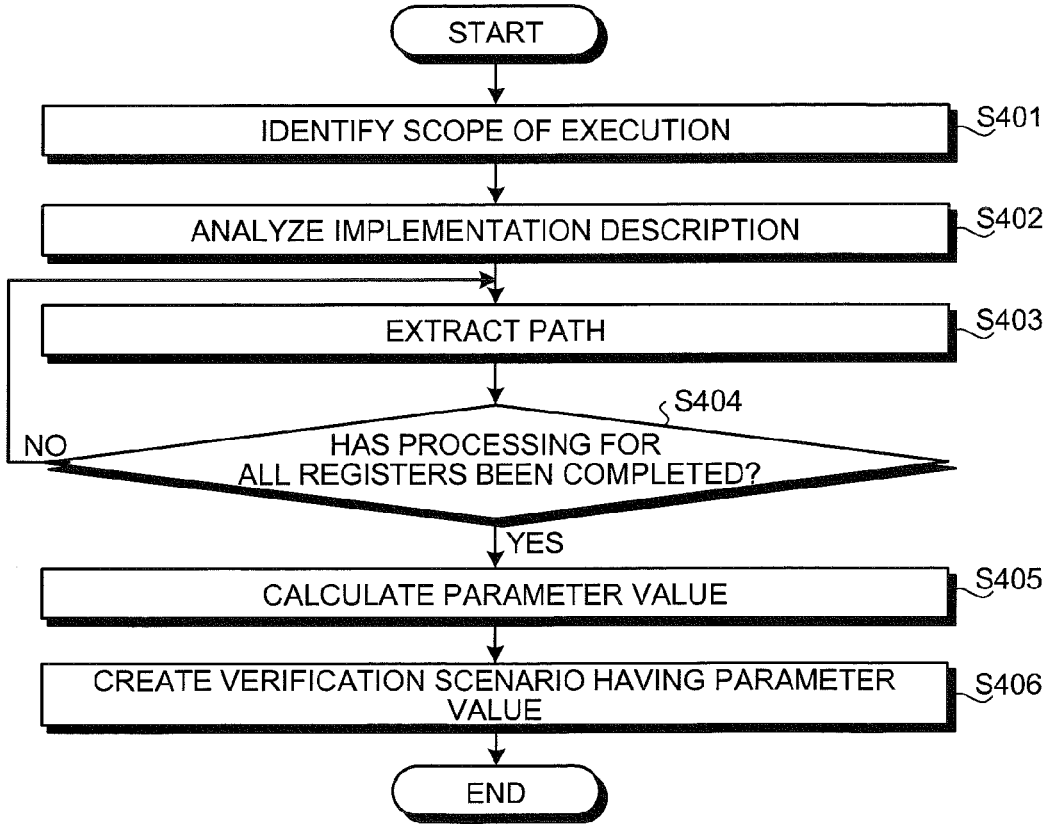

FIG.5

```
SPECIFICATIONS                                                          500
<CALCULATE AREA OR SUM OF THREE SIDES OF TRIANGLE>
 > INPUT USING PARAMETERS p1, p2 TO SELECT EITHER OF THREE SIDES a, b, AND c, AND AREA, OR THREE SIDES OF TRIANGLE
 > USE FUNCTION S(a, b, c) TO CALCULATE AREA "t"
 > SUM OF THREE SIDES IS "L"
 > PUT OUTPUT INTO TEXT RESULT d USING EITHER OF AREA t OR SUM OF THREE SIDES L
 > AFTER SETTING INPUT a, b, c, p1, AND p2, SET start SIGNAL AND CALCULATION IS STARTED
 > WHEN RESULT OF CALCULATION IS PUT IN OUTPUT d, finish SIGNAL IS OUTPUT
```

VERIFICATION SCENARIO
- RESET
- SET SIDE a IN REGISTER r1
- SET SIDE b IN REGISTER r2
- SET SIDE c IN REGISTER r3
- SET PARAMETER p1 IN REGISTER r4
- SET PARAMETER p2 IN REGISTER r5
- SET start SIGNAL TO 1
- WAIT FOR finish SIGNAL
- WHEN finish SIGNAL IS RECEIVED, READ RESULT d FROM REGISTER r6

| REGISTER NAME | MODEL | Read/ Write | MINIMAL VALUE | MAXIMAL VALUE | TYPICAL VALUE | CONTROL CONDITION |
|---|---|---|---|---|---|---|
| r1 | [7:0] | W | 1 | 255 | 127 | USE EVEN VALUE |
| r2 | [7:0] | W | 1 | 255 | 127 | NONE |
| r3 | [7:0] | W | 1 | 255 | 127 | USE ODD VALUE |
| r4 | [0:0] | W | 0 | 1 | 1 | NONE |
| r5 | [0:0] | W | 0 | 1 | 1 | NONE |
| t | [7:0] | - | 0 | 255 | - | NONE |
| L | [7:0] | - | 0 | 255 | - | NONE |
| r6 | [7:0] | R | 1 | 255 | - | NONE |

FIG.8

```
// $Date: 2007-11-14 17:35:35+09 $          // reset
`timescale 1ps/1ps                          always @(posedge CLK or negedge RST) begin
                                               if (~RST) begin
module cdfg                                       t <=0;
(                                              end
   CLK, RST, a, b, c, d, p1, p2, start, finish end
);
                                            // start flag transition
   input CLK;                               always @(posedge CLK) begin        ← 802
   input RST;                                  flag2 <= flag1;
   input [7:0] a;                              flag3 <= flag2;
   input [7:0] b;                              flag4 <= flag3;
   input [7:0] c;                              flag5 <= flag4;    // output as finish
   input [7:0] p1;                          end
   input [7:0] p2;
   output [7:0] d;                          always @(posedge flag1) begin
   input      start;                           t <= 0;  ← 803
   output     finish;                       end reg [7:0]   r1;                          always @(posedge flag2)begin
   reg [7:0]   r2;                             if(r4==0) t <= S;  ← 804
   reg [7:0]   r3;                             else L <= (r1 + r2) + r3;  ← 805
   reg         r4;             } 801       end
   reg         r5;
   reg [7:0]   r6;                          always @(posedge flag3)begin
                                               if(r5==0) r6 <= t;  ← 806
   reg [7:0]   t;                              else L <= ;t  ← 807
   reg [7:0]   L;                           end reg         flag1;                       always @(posedge flag4) begin
   reg         flag2;                          if(r5==1) r6 <= t;  ← 808
   reg         flag3;                       end
   reg         flag4;
   reg         flag5;                       // Area calculator unit (combinational circuit)
   wire        S;                           TriangleArea TriangleArea
                                            (
   assign   a=r1;                              .CLK (CLK),
   assign   b=r2;                              .edge1 (r1),
   assign   c=r3;                              .edge2 (r2),
   assign   p1=r4;                             .edge3 (r3),
   assign   p2=r5;                             .area (S)
   assign   d=r6;                           );
   assign   start=flag1;
   assign   finish=flag5;                   endmodule
```

800

|  |  | after | | |
|---|---|---|---|---|
|  |  | Initialize | Read | Write |
| before | Declare | $\alpha$ | $\gamma$ | $\beta$ |
|  | Initialize | $\alpha$ | $\beta$ | $\alpha$ |
|  | Read | $\alpha$ | $\alpha$ | $\alpha$ |
|  | Write | $\beta$ | $\alpha$ | $\gamma$ |

FIG. 19

| VERIFICATION SCENARIO HAVING PARAMETER ||||| 
|---|---|---|---|---|
| CLASSIFICATION | TRANSITION OF DIRW MATRIX | VERIFICATION PARAMETER | PARAMETER CONTROL | VERIFICATION SCENARIO |
| VERIFICATION SCENARIO FOR γ | W→W | [r1,r2,r3,r4,r5] = [x1,x2,x3,0,1] | 1≦x1≦255 AND x1=EVEN VALUE | 1. RESET |
| VERIFICATION SCENARIO FOR β | I→R | [r1,r2,r3,r4,r5] = [x1,x2,x3,1,0] | 1≦x2≦255 | 2. SET SIDE a IN REGISTER r1 |
| VERIFICATION SCENARIO FOR α | D→I | [r1,r2,r3,r4,r5] = [x1,x2,x3,x4,x5] | 1≦x3≦255 AND x3=ODD VALUE | 3. SET SIDE b IN REGISTER r2 |
| | I→W | [r1,r2,r3,r4,r5] = [x1,x2,x3,0,x5] | x4=0,1 | 4. SET SIDE c IN REGISTER r3 |
| | W→R | [r1,r2,r3,r4,r5] = [x1,x2,x3,0,0] = [x1,x2,x3,x4,1] | x5=0,1 | 5. SET PARAMETER p1 IN REGISTER r4 |
| | | | | 6. SET PARAMETER p2 IN REGISTER r5 |
| | | | | 7. SET start SIGNAL 1 |
| | | | | 8. WAIT FOR finish SIGNAL |
| | | | | 9. WHEN finish SIGNAL IS RECEIVED, READ RESULT d FROM REGISTER r6 |

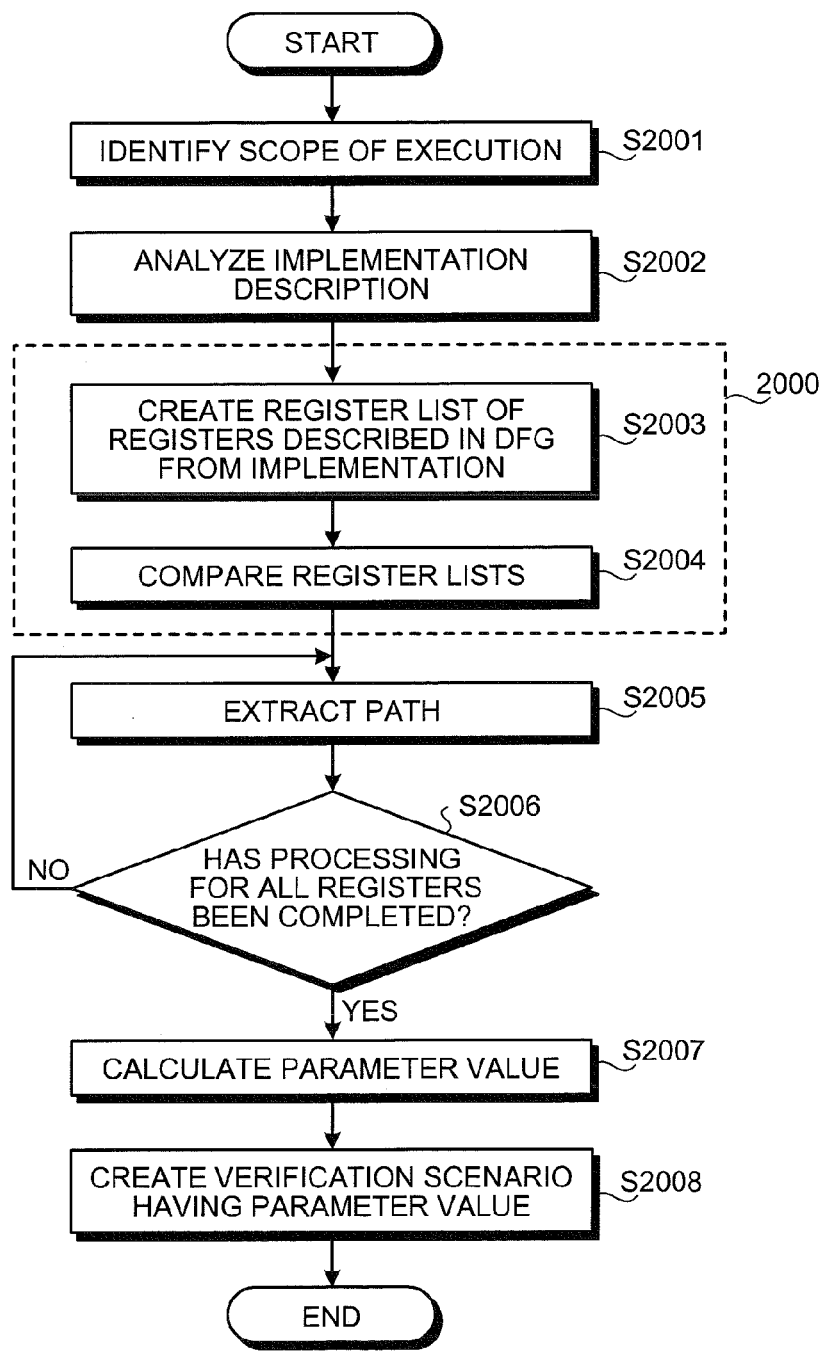

FIG. 21

```
// $Date: 2008-01-16 17:49:01+09 $
`timescale 1ps/1ps module cdfg
(
    CLK, RST, a, b, c, d, p1, p2, start, finish
);

input CLK;
    input RST;
    input [7:0] a;
    input [7:0] b;
    input [7:0] c;
    input [7:0] p1;
    input [7:0] p2;
    output [7:0] d;
    input         start;
    output        finish;

reg [7:0]   r1;
    reg [7:0]   r2;
    reg [7:0]   r3;
    reg         r4;
    reg         r5;
    reg [7:0]   r6;

reg [15:0]  t;
    reg [7:0]   L;

reg [7:0]   tmp_reg;  ← 2101 reg         flag1;
    reg         flag2;
    reg         flag3;
    reg         flag4;
    reg         flag5;
    reg         flag6;
    wire        S;

assign      a=r1;
    assign      b=r2;
    assign      c=r3;
    assign      p1=r4;
    assign      p2=r5;
    assign      d=r6;
    assign      start=flag1;
    assign      finish=flag6;
```

```
// reset
always @(posedge CLK or negedge RST) begin
    if (~RST) begin
        t <=0;
    end
end // start flag transition
always @(posedge CLK) begin ← 2102
    flag2 <= flag1;
    flag3 <= flag2;
    flag4 <= flag3;
    flag5 <= flag4;
    flag6 <= flag5; // output as finish
end // CFG
always @(posedge flag1) begin
    t <= 0;  ← 2103
end always @(posedge flag2) begin
    if(r4==0) tmp_reg <= S;      ← 2104
    else begin
        L <= (r1 + r2) + r3;     ← 2105
        t <= tmp_reg;
    end
end always @(posedge flag3) begin
    if(r4==0) t <= tmp_reg;
end always @(posedge flag4) begin
    if(r5==0) r6 <= t;           ← 2106
    else t <= L;                 2107
end always @(posedge flag5) begin
    if(r5==1) r6 <= t;
end
// end of cfg // Area calculator unit (combinational circuit)
TriangleArea TriangleArea
(
    .CLK (CLK),
    .edge1 (r1),
    .edge2 (r2),
    .edge3 (r3),
    .area (S)
);

endmodule    // cdfg
```

| REGISTER NAME | MODEL | Read/Write | MINIMAL VALUE | MAXIMAL VALUE | TYPICAL VALUE | CONTROL CONDITION |
|---|---|---|---|---|---|---|
| tmp_reg | [7:0] | – | – | – | – | – |
| r1 | [7:0] | W | 1 | 255 | 127 | USE EVEN VALUE |
| r2 | [7:0] | W | 1 | 255 | 127 | NONE |
| r3 | [7:0] | W | 1 | 255 | 127 | USE ODD VALUE |
| t | [15:0] | – | 0 | 255 | – | NONE |
| L | [7:0] | – | 0 | 255 | – | NONE |
| r6 | [7:0] | R | 1 | 255 | – | NONE |

|  |  | after | | |
|---|---|---|---|---|
|  |  | Initialize | Read | Write |
| Before | Declare | α | γ | β |
|  | Initialize | α | α | α |
|  | Read | α | α | α |
|  | Write | β | α | β |

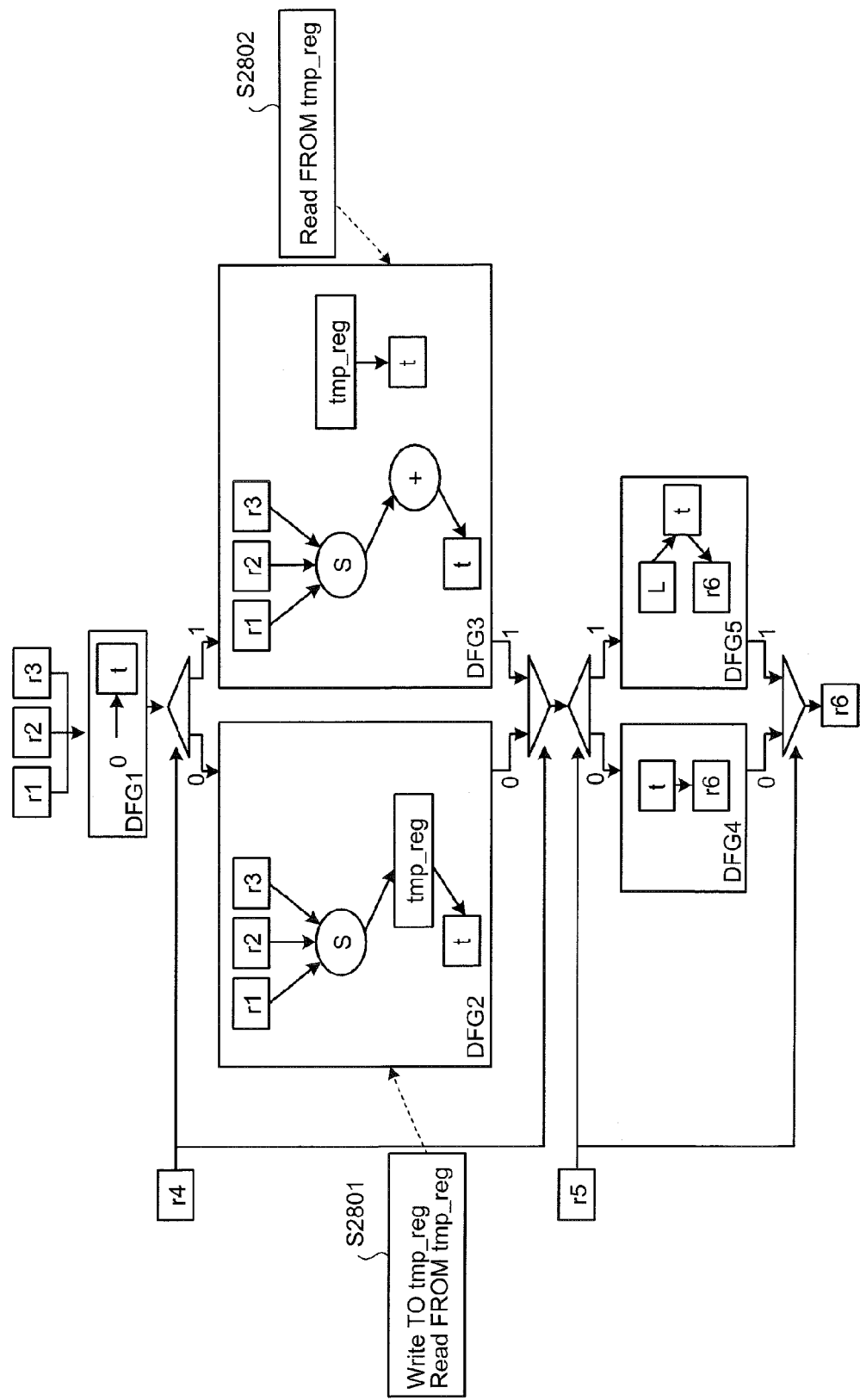

FIG.33

VERIFICATION SCENARIO HAVING PARAMETER                                                                      1900

| CLASSIFICATION | TRANSITION OF DIRW MATRIX | VERIFICATION PARAMETER | PARAMETER CONTROL | VERIFICATION SCENARIO |
|---|---|---|---|---|
| VERIFICATION SCENARIO FOR γ | D→R | [r1,r2,r3,r4,r5]<br>=[x1,x2,x3,1,x5] | $1 \leq x1 \leq 255$<br>AND<br>x1=EVEN VALUE | 1. RESET<br>2. SET SIDE a IN REGISTER r1<br>3. SET SIDE b IN REGISTER r2<br>4. SET SIDE c IN REGISTER r3<br>5. SET PARAMETER p1 IN REGISTER r4<br>6. SET PARAMETER p2 IN REGISTER r5<br>7. SET start SIGNAL 1<br>8. WAIT FOR finish SIGNAL<br>9. WHEN finish SIGNAL IS RECEIVED, READ RESULT d FROM REGISTER r6 |
| VERIFICATION SCENARIO FOR β | D→W | [r1,r2,r3,r4,r5]<br>=[x1,x2,x3,1,x5] | $1 \leq x2 \leq 255$ | |
| VERIFICATION SCENARIO FOR α | W→R | [r1,r2,r3,r4,r5]<br>=[x1,x2,x3,0,x5] | $1 \leq x3 \leq 255$<br>AND<br>x3=ODD VALUE<br><br>x4=0,1<br><br>x5=0,1 | |

VERIFICATION SUPPORTING APPARATUS, VERIFICATION SUPPORTING METHOD, AND COMPUTER PRODUCT

CROSS-REFERENCE TO RELATED APPLICATIONS

This application is based upon and claims the benefit of priority from the prior Japanese Patent Application No. 2008-118249, filed on Apr. 30, 2008, the entire contents of which are incorporated herein by reference.

BACKGROUND OF THE INVENTION

1. Field of the Invention

The present invention relates to circuit verification and more particularly to verification of a register in a circuit.

2. Description of the Related Art

Conventionally, when hardware (a circuit) is designed to implement a desired function, work to execute logic verification to check for oversights in the contents of the design is necessary prior to proceeding to the actual hardware fabrication. More specifically, a verification scenario in line with the contents of the design of the hardware is created and logic verification is executed using the output result obtained when the verification scenario is input. For an example, refer to the convention art disclosed in Japanese Patent Application Laid-Open Publication No. 2006-190209.

However, parameter settings of a verification scenario used for conventional logic verification have many deficiencies arising in a problem of low verification efficiency. For example, one approach involves executing a verification scenario into which a randomly designated parameter is substituted. However, this approach can not cover all the verification examples and, therefore, verification oversights may occur.

Further, another approach proposes designating the maximal value, the minimal value, and a typical value among the values that can be as the parameters. However, the path that was originally intended to be verified may not be included the verification. In both of the approaches above, the use and the range of a value to be designated as a parameter is defined according to the specification of the hardware design. Therefore, the verification scenario is not a verification scenario for which a parameter is set to cover a specific register in the hardware. Therefore, the verification efficiency cannot be improved.

When hardware is designed based on specifications, a register that is not specified in the specifications may be disposed according to the configuration for implementation. No parameter for the verification scenario is considered for the implementation-dependent register that is used only for the implementation as above. Therefore, no verification that covers the case where the implementation-dependent register is present in the designed hardware is executed, a factor that reduces verification efficiency.

SUMMARY OF THE INVENTION

It is an object of the present invention to at least solve the above problems in the conventional technologies.

A computer-readable recording medium according to one aspect of the present invention stores therein a verification supporting program that causes a computer to execute: recording in a memory, a DIRW matrix in which, among four states including Declare, Initialize, Read, and Write, a state transition that has a possibility of occurring in a register included in a circuit to be verified, and information concerning validity of a path corresponding to the state transition are set; acquiring a control data flow graph that includes a control flow graph having a flow of control for implementation of the circuit to be verified described therein and further having a data flow graph written therein, the data flow graph having a flow of data in the control flow graph described therein; extracting, from the control data flow graph and when an arbitrary register in the circuit to be verified is designated as a register to be verified, a data flow graph that has described therein the register to be verified; extracting, from the data flow graph extracted at the extracting the data flow graph, a path indicating the flow of data concerning the register to be verified; identifying, based on the data flow graph, the state transition of the path extracted at the extracting the path; determining whether the state transition identified at the identifying is set in the DIRW matrix; correlating, when at the determining, the state transition of the path has been determined to be set in the DIRW matrix, information concerning the validity set in the DIRW matrix and the path as a path to be verified of the register to be verified; and outputting the path to be verified and the information concerning the validity correlated at the correlating.

A computer-readable recording medium according to another aspect of the present invention stores therein a verification supporting program that causes a computer to execute: recording in a memory, a DIRW matrix in which, among four states including Declare, Initialize, Read, and Write, a state transition that has a possibility of occurring in a register included in a circuit to be verified, and information concerning validity of a path corresponding to the state transition are set; acquiring implementation information of the circuit to be verified, a verification scenario that is representative of contents of verification for the circuit to be verified, and a register list that indicates attributes of registers included in specifications of the circuit to be verified; creating, from the implementation information and the register list acquired at the acquiring, a control data flow graph that includes a control flow graph having a flow of control for implementation of the circuit to be verified described therein and further having a data flow graph written therein, the data flow graph having a flow of data in the control flow graph described therein; extracting, from the control data flow graph created at the creating, a data flow graph that has described therein a register that is inaccessible from outside the circuit to be verified and among the registers included in the circuit to be verified; extracting, from the data flow graph extracted at the extracting the data flow graph, a path indicating the flow of data concerning the register; identifying, based on the data flow graph, the state transition of the path extracted at the extracting the path; determining whether the state transition identified at the identifying is set in the DIRW matrix; calculating, using the verification scenario acquired at the acquiring and the control data flow graph, a value that can be substituted as a parameter in the register connected to the path, when at the determining, the state transition of the path has been determined to be set in the DIRW matrix; and creating a verification scenario having a parameter that is obtained by setting the value calculated at the calculating in the verification scenario.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3B is a flowchart of a procedure for extracting a path to be verified;

FIG. 4 is a flowchart of a procedure for creating a verification scenario for an internal register to be verified;

FIG. 5 is a view of specifications of a circuit to be verified;

FIG. 6 is a view of an exemplary description of the verification scenario;

FIG. 7 is a view of an exemplary register list included in the specifications;

FIG. 8 is a view of an exemplary description of RTL description (internal register verification);

FIG. 19 is a chart of an exemplary output of a verification scenario having a parameter set (internal register verification);

FIG. 20 is a flowchart of a creating procedure of the verification scenario for an implementation-dependent register to be verified;

FIG. 21 is a view of an exemplary description of RTL description including implementation-dependent registers;

FIG. 26 is a chart of an implementation-dependent-register list;

FIG. 28 is a view of a procedure of extracting a path concerning an implementation-dependent register tmp_reg;

FIG. 33 is a chart of an exemplary output of a verification scenario having a parameter set (implementation-dependent register)

DETAILED DESCRIPTION OF THE PREFERRED EMBODIMENTS

Referring to the accompanying drawings, exemplary embodiments according to the present invention are explained in detail below.

Figure 1:
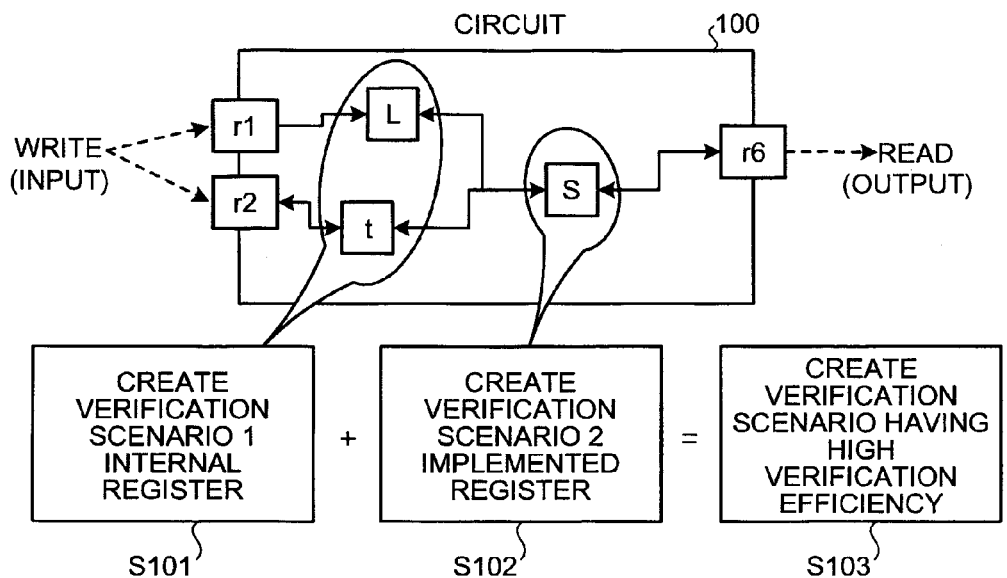
FIG. 1 is a schematic of a verification supporting process according to an embodiment.

FIG. 1 is a schematic of a verification supporting process according to the embodiment. As depicted in FIG. 1, a register is classified according to the configuration of a circuit to be verified (in this case, a circuit 100 is to be verified) when hardware is verified. The verification scenario is created according to a procedure that differs according to the classification in each case.

The registers are roughly classified into three types. Among the classified registers, in the embodiment, a verification scenario is created to verify an internal register and an implementation-dependent register for which the verification efficiency is conventionally low. The three types of classifications include:

1. I/O register that is accessible from outside a circuit to be verified

Example) r1 and r2 of the circuit 100 to be verified

2. Internal register specified in the specifications

Example) L and t of the circuit 100 to be verified

3. Implementation-dependent register whose presence or absence is determined depending on the implementation and that is not specified in the specifications Example) S of the circuit 100 to be verified Therefore, in the case of the circuit 100 to be verified, a verification scenario 1 is created that focuses on the internal registers L and t (step S101). A verification scenario 2 is created that focuses on the implementation-dependent register S (step S102). By combining these two verification scenarios, a verification scenario having high verification efficiency can be created (step S103). The order of the steps S101 and S102 at which the verification scenarios 1 and 2 are created does not matter.

Figure 2:
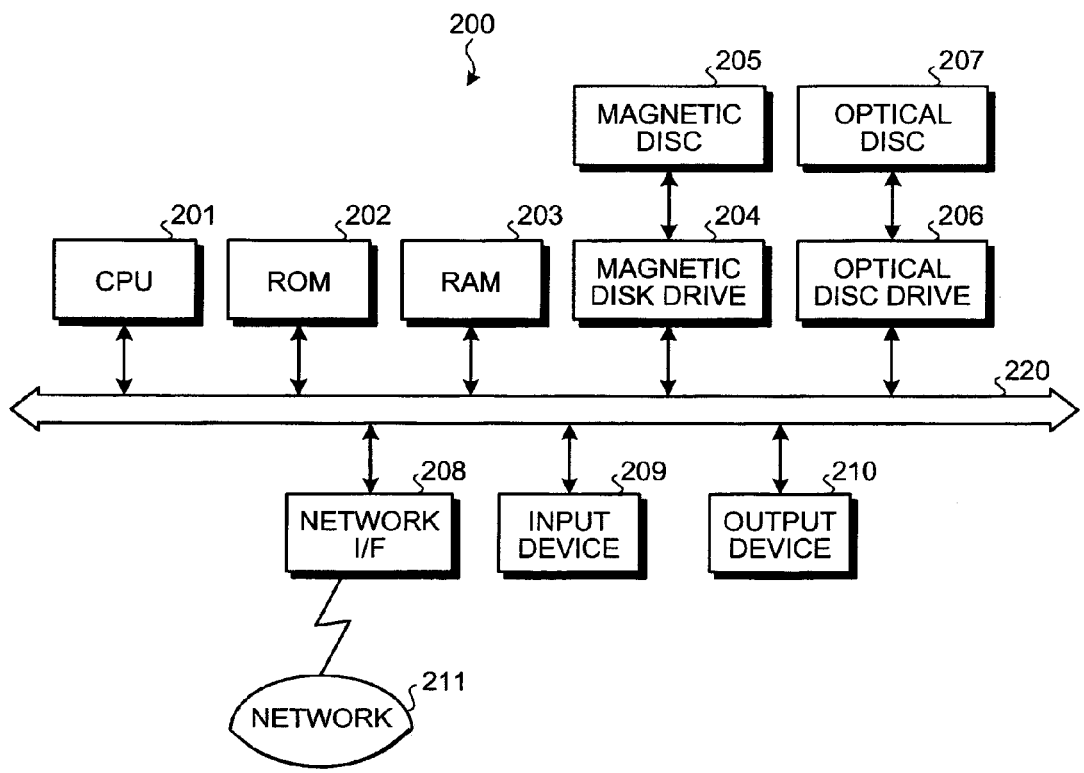
FIG. 2 is a block diagram of a verification supporting apparatus.

FIG. 2 is a block diagram of a verification supporting apparatus. As depicted in FIG. 2, a verification supporting apparatus 200 includes a central processing unit (CPU) 201, a read only memory (ROM) 202, a random access memory (RAM) 203, a magnetic disc drive 204, a magnetic disc 205, an optical disc drive 206, an optical disc 207, a communication interface (I/F) 208, an input device 209, and an output device 210. These components are connected by a bus 220.

The CPU 201 governs control of the entire verification supporting apparatus 200. The ROM 202 stores therein various programs such as a boot program and a verification supporting program. The RAM 203 is used as a work area of the CPU 201. The magnetic disc drive 204 controls the reading/writing of data from/to the magnetic disc 205 under the control of the CPU 201. The magnetic disc 205 stores therein data written thereto under the control of the magnetic disc drive 204. The ROM 202 may store therein a verifying program that executes verification simulations according to the verification scenarios created by the verification supporting program. In such a case, not only the verification scenarios but also the actual verification results can be provided by the verification supporting apparatus 200.

The optical disc drive 206 controls the reading/writing of data from/to the optical disc 207 under the control of the CPU 201. The optical disc 207 stores therein the data written thereto under the control of the optical disc drive 206, and allows a computer to read the data stored therein.

The communication I/F 208 is connected to a network 211 such as a local area network (LAN), a wide area network (WAN), and the Internet through a communication line and is connected to other apparatuses through this network 211. The communication I/F 208 administers an internal interface with the network 211 and controls the input/output of data from/to external apparatuses. For example, a modem or a LAN adapter may be employed as the communication I/F 208.

The input device 209 receives input from an external source to the verification supporting apparatus 200. The input device 209 can specifically be a keyboard, a mouse, etc.

In the case of the keyboard, the keyboard includes, for example, keys for inputting letters, numerals, and various instructions and performs the input of data. The input device 209 may be a touch-panel-type input pad or numeric keypad, etc. In the case of a mouse, the input device 209, for example, performs the movement of the cursor, selection of a region, or movement and size change of windows. The input device 209 may be a track ball or a joy stick provided each respectively has a function similar to a pointing device.

The output device 210 outputs the verification scenarios created by the verification supporting apparatus 200 and the verification results obtained from the verification scenarios. The output device 210 can specifically be a display, a printer, etc.

In the case of a display, the output device 210 displays data such as texts, images, functional information, etc., in addition to a cursor, icons, or tool boxes. A cathode ray tube (CRT), a thin-film-transistor (TFT) liquid crystal display, a plasma display, etc., may be employed as the display. In the case of a printer, the output device 210, for example, prints image data and text data. A laser printer or an ink jet printer may be employed as the printer.

Figure 3A:
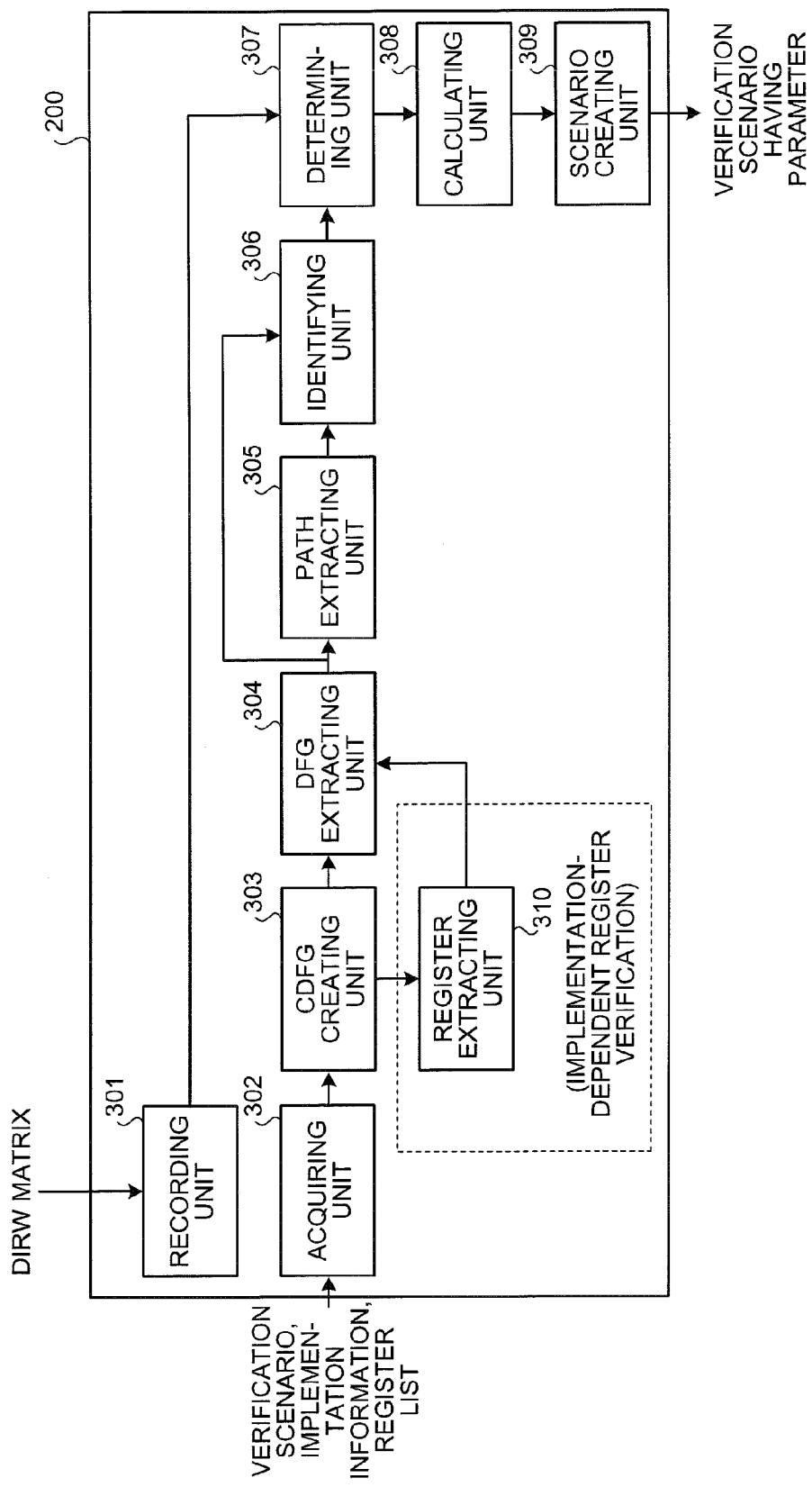
FIG. 3A is a functional diagram of the verification supporting apparatus.

FIG. 3A is a functional diagram of the verification supporting apparatus. The verification supporting apparatus 200 includes a recording unit 301, an acquiring unit 302, a CDFG creating unit 303, a DFG extracting unit 304, a path extracting unit 305, an identifying unit 306, a determining unit 307, a calculating unit 308, a scenario creating unit 309, and a register extracting unit 310. More specifically, the functions of these units working as a control unit (the acquiring unit 302 to the scenario creating unit 309) are implemented by, for example, causing the CPU 301 to execute programs stored in a storage area such as the ROM 202, the RAM 203, the magnetic disc 205, and the optical disc 207 depicted in FIG. 2 or by using the communication I/F 208.

The recording unit 301 is a functional unit that has recorded therein a DIRW matrix in which 1) a state transition that has a potential of occurring in a register included in the circuit to be verified and is among four states including "Declare", "Initialize", "Read", and "Write" and 2) information concerning the validity of a path corresponding to the state transition are set. The intent of the design of the circuit 100 to be verified is reflected in the information concerning the validity of a path in the DIRW matrix. The recording unit 301 is implemented, for example, using the magnetic disc 205, the optical disc 207, etc.

The acquiring unit 302 is a functional unit that acquires input data to create a verification scenario with a parameter value that is the output data of the verification supporting apparatus 200. More specifically, the acquiring unit 302 acquires a verification scenario (without any parameter) that is representative of the contents of the verification for the circuit 100 to be verified, implementation information concerning the circuit 100 to be verified, and a register list that indicates the attributes of registers included in the specifications of the circuit 100 to be verified. The acquired data is stored in a storage area such as the RAM 203, the magnetic disc 205, and the optical disc 207.

The CDFG creating unit 303 is a functional unit that creates, from the implementation information and the register list acquired by the acquiring unit, a control data flow graph (CDFG) that includes a control flow graph (CFG) having the flow of the control for the implementation of the circuit 100 to be verified described therein and further having a data flow graph (DFG) written therein. The DFG has described therein the flow of data in the CFG. The created CDFG is stored in a storage area such as the RAM 203, the magnetic disc 205, or the optical disc 207.

The DFG extracting unit 304 is a functional unit that extracts, from the CDFG created by the CDFG creating unit 303, the DFG describing registers designated as the registers to be verified among the registers included in the circuit 100 to be verified. In the embodiment, description hereinafter is based on the assumption that, among the two types of registers to be verified (the internal registers and the implementation-dependent registers), the internal registers are taken as the registers to be verified. However, when implementation-dependent registers are taken as the registers to be verified, work of extracting the implementation-dependent registers from the implementation of the circuit 200 to be verified is necessary. This extraction of the registers will be mentioned in the description of the register extracting unit 310. Information concerning the extracted DFG is stored in a storage area such as the RAM 203, the magnetic disc 205, or the optical disc 207.

The path extracting unit 305 is a functional unit that extracts a path representative of the flow of data in the internal registers from the DFG extracted by the DFG extracting unit 304. The extracted path information is stored in a storage area such as the RAM 203, the magnetic disc 205, or the optical disc 207.

The identifying unit 306 is a functional unit that identifies, based on the DFG, the state transition of a register to be verified included in the path extracted by the path extracting unit 305. The state transition of an implementation-dependent register included in the path is a change between the pre-state and the post-state of each of the four states of "Declare", "Initialize", "Read", and "Write" as described for the DIRW matrix. More specifically, a transition from "Declare" to "Read", a transition from "Initialize" to "Write", etc., are present and each transition is able to be determined from the description in the DFG. The result of the identification is stored in a storage area such as the RAM 203, the magnetic disc 205, or the optical disc 207.

The determining unit 307 is a functional unit that determines whether a state transition identified by the identifying unit 306 is set in the DIRW matrix. A determination result is stored in a storage area such as the RAM 203, the magnetic disc 205, or the optical disc 207.

When it is determined by the determining unit 307 that the state transition of the path is set in the DIRW matrix, the calculating unit 308 calculates, using the verification scenario acquired by the acquiring unit 302 and the CDFG, a value that can be substituted as a parameter in the internal register connected to the path. The calculation result is stored in a storage area such as the RAM 203, the magnetic disc 205, or the optical disc 207.

The scenario creating unit 309 creates a verification scenario having a parameter value that is obtained by setting the value calculated by the calculating unit 308 in the verification scenario. The verification scenario having a parameter value created by the scenario creating unit 309, for example, may be displayed on a display or output to and printed by a printer adopted as the output device 209, or be transmitted to an external apparatus by the communication I/F 208. The created verification scenario having a parameter value may also be stored in a storage area such as the RAM 203, the magnetic disc 205, or the optical disc 207.

As described above, in a case where an internal register is taken as the register to be verified, when a user of the verification supporting apparatus 200 designates a specific internal register from the specifications, a verification scenario that covers verification of the internal register can be created. On the other hand, in the case of an implementation-dependent register, the register cannot be designated in advance as the register to be verified because the register is not described in the specification. Therefore, the register extracting unit 310 must individually extract the implementation-dependent register mounted on the circuit 100 to be verified.

The register extracting unit 310 extracts, as the implementation-dependent registers that are mounted depending on the configuration for the implementation, registers that are among the registers described in the CDFG and not included in the register list acquired by the acquiring unit 302. More specifically, the register extracting unit 310 compares the registers described in the CDFG with the registers included in the register list, and extracts, as the implementation-dependent registers, the registers that are not included in the register list. Information concerning the extracted implementation-dependent registers is stored in a storage area such as the RAM 203, the magnetic disc 205, or the optical disc 207.

When the register extracting unit 310 extracts the implementation-dependent registers, the extracted implementation-dependent registers are the registers to be verified. Therefore, the DFG extracting unit 304 extracts the DFG that has described therein the flow of the data concerning the implementation-dependent registers extracted by the register extracting unit 310 from the CDFG created by the CDFG creating unit 303. Subsequently, the path extracting unit 305 to the scenario creating unit 309 execute process steps for the register to be verified as process steps concerning an implementation-dependent register.

In the case where a verification scenario is created taking a specific register included in the verification supporting apparatus 200 as the register to be verified as described above, regardless of register set to be the register to be verified, the core process includes the process of extracting a path that requires verification (hereinafter, path to be verified) from the implementation of the verification supporting apparatus 200.

FIG. 3B is a flowchart of a procedure for extracting a path to be verified. As depicted in FIG. 3B, the CDFG of the circuit 100 to be verified is acquired (step S321). The DFG including the register to be verified is extracted from the acquired CDFG (step S322). A path concerning the register to be verified is extracted by referring to the DFG extracted at step S322 (step S323).

The state transition of the path extracted at step S323 is identified (step S324). Whether the identified state transition is set in the DIRW matrix is determined (step S325). When the identified state transition is not set in the DIRW matrix (step S325: NO), the series of process steps comes to an end without the execution of any additional steps. On the other hand, when the identified state transition is set in the DIRW matrix (step S325: YES), the identified state transition together with the information concerning the validity that is set in the DIRW matrix is output as the path to be verified of the register to be verified (step S326) and the series of process steps comes to an end.

As described above, the verification supporting process according to the embodiment enables extraction of the path to be verified that is necessary for verifying the register to be verified. In addition, through the preparation of the DIRW matrix in which the intent of the design is reflected and the comparison of the DIRW matrix with the path to be verified, the path to be verified and the information concerning the validity are correlated with each other and output. Thus, a verification scenario for comprehensively verifying the extracted path to be verified can be easily created and verification efficiency can be improved.

As described with reference to FIG. 1, according to the embodiment, a verification scenario is created that has a parameter set to cover a path necessary in the verification of internal registers described in the specifications and implementation-dependent registers not described in the specifications. Therefore, description will follow concerning the procedure of creating a verification scenario in each of the cases where an internal register is to be verified, and where an implementation-dependent register is to be verified.

FIG. 4 is a flowchart of the procedure for creating a verification scenario for an internal register to be verified. Information used for creating the verification scenario is described before describing the actual procedure. The embodiment creates a verification scenario by receiving the input information including items i) to iv) below.

i) Verification scenario
ii) List of registers to be verified
iii) Implementation information of hardware
iv) DIRW matrix Each of the information items will be described. In particular, the use of item iv) DIRW matrix is a featured process of the embodiment.

As depicted in the flowchart of FIG. 4, the scope of execution in the verification scenario is identified through the input of items i) to iii) among the information items above (step S401) and the implementation description is analyzed (step S402). Thereafter, a path is extracted through the input of item iv) the DIRW matrix (step S403). Subsequently, whether processing for all the registers to be verified has been completed is determined (step S404) and the process of extracting a path is repeated until the processing for all the registers to be verified has been completed (step S404: NO). When the processing for all the registers has been completed (step S404: YES), the parameter is calculated (step S405), the verification scenario having a parameter is created (step S406), and the series of process steps comes to an end. Description detailing the process at each step and information being input follows.

At step S401, information concerning a register transfer level (RTL) description for the entire system, a verification scenario for the entire system, and a register list of the entire system are input (corresponding to the items i) to iii) above). FIG. 5 is a view of specifications of the circuit to be verified. The verification scenario of the circuit 100 to be verified input at step S401 is set according to the contents of the description in specifications 500.

FIG. 6 is a view of an exemplary description of the verification scenario. A verification scenario 600 depicted in FIG. 6 is configured by a verifying process reflecting the specifications 500 described with reference to FIG. 5. FIG. 7 is a view of an exemplary register list included in the specifications. The registers in the verification scenario 600 have the configurations described in a register list 700. FIG. 8 is a view of an exemplary description of the RTL description (internal register verification). An RTL description 800 is the implementation information concerning the hardware. A description 801 in the RTL description 800 corresponds to the registers described in the register list 700 (see FIG. 7).

When the information above is input, the verification scenario 600 extracts the scope of execution of the verification from the entire RTL description 800 at step S401. After the processing at step S401, the RTL description concerning the identified scope, the verification scenario, and the register list are output.

Upon the identification of the scope of execution at step S401, a user may execute the extraction of the scope with respect to information that has been input or may use a known technique. For example, the use of a technique described in Japanese Patent Application Laid-Open Publication No. 2006-190209 enables easy identification of the scope of the execution. In addition, the process at step S401 is a selecting process to support verification by identifying, within the entire system, the scope that, for the user, requires verification. Therefore, step S401 enables improvement of the processing efficiency of the entire verification supporting process. The process at step S401 may be omitted and the entire system may be the target of the verification.

At step S402, the RTL description whose scope of execution is identified at step S401 (see FIG. 8) and the register list (see FIG. 7) are input. The CFG that is representative of the flow of the control and the DFG that is representative of the flow of the data are created from the input RTL description.

Figure 9:
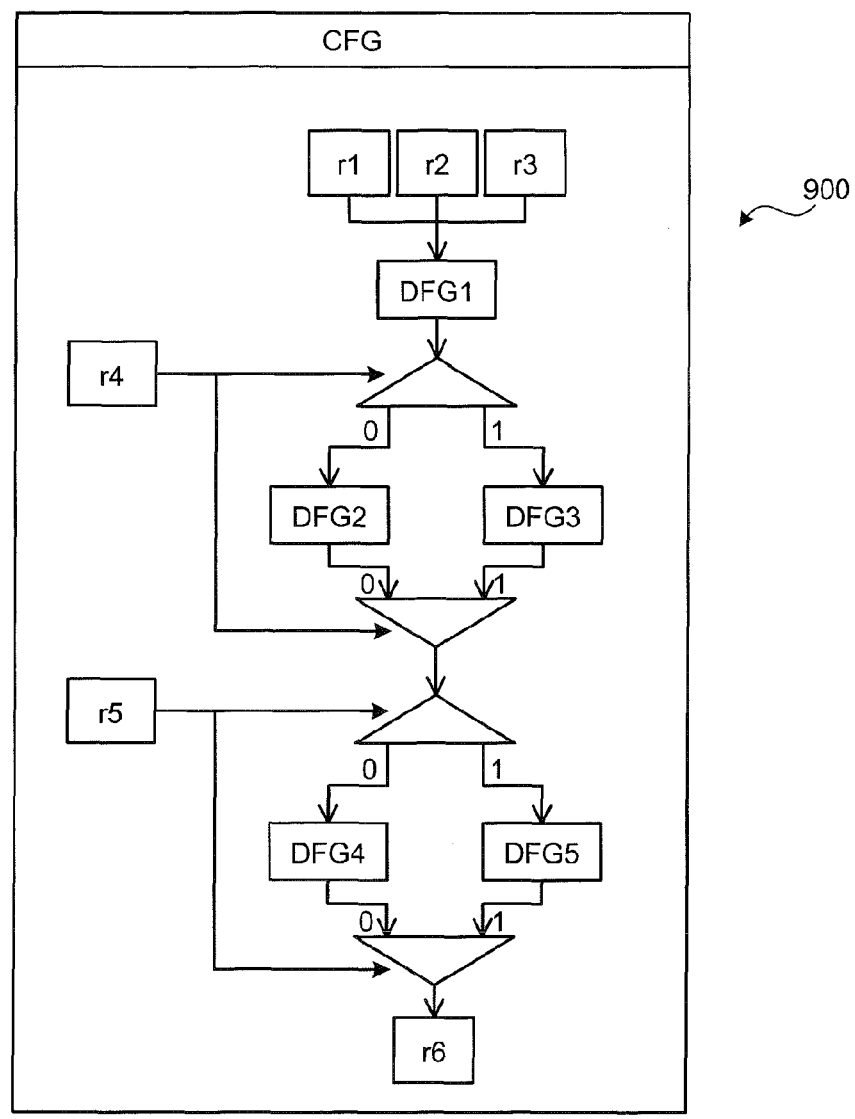
FIG. 9 is a circuit diagram of an exemplary configuration of a CFG (internal register verification)
Figure 10A:
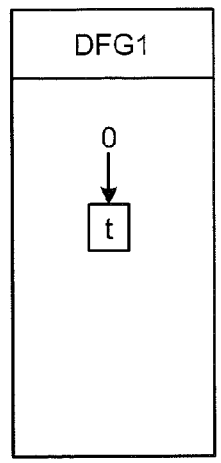
FIGS. 10A to 10E are circuit diagrams of the configurations of DFGs 1 to 5, respectively (internal register verification)
Figure 10B:
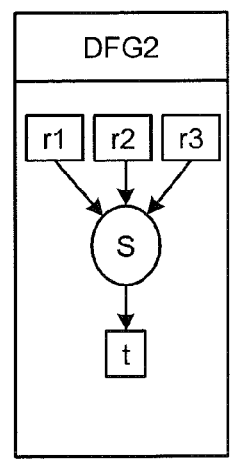
Figure 10C:
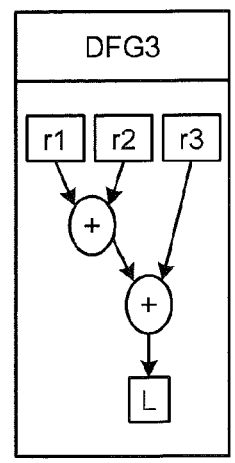
Figure 10D:
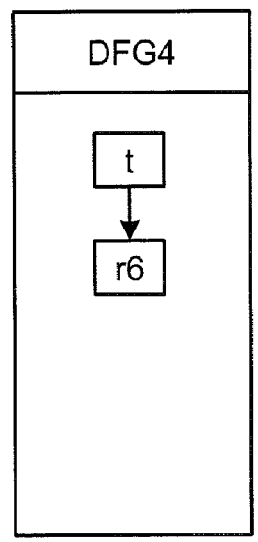
Figure 10E:
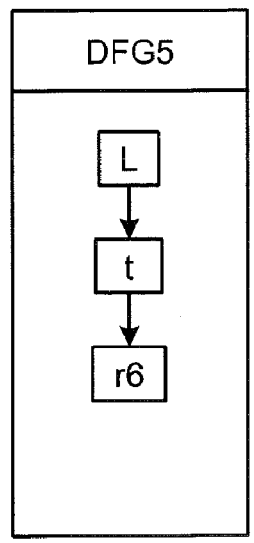

FIG. 9 is a circuit diagram of an exemplary configuration of a CFG (internal register verification). The CFG 900 depicted in FIG. 9 visually depicts the flow of the control by the RTL description. For the RTL description 800 depicted in FIG. 8, the control of the data is executed by descriptions 802 to 808. Therefore, the flow of the processing of the CFG 900 corresponds to the descriptions 802 to 808.

Figure 11:
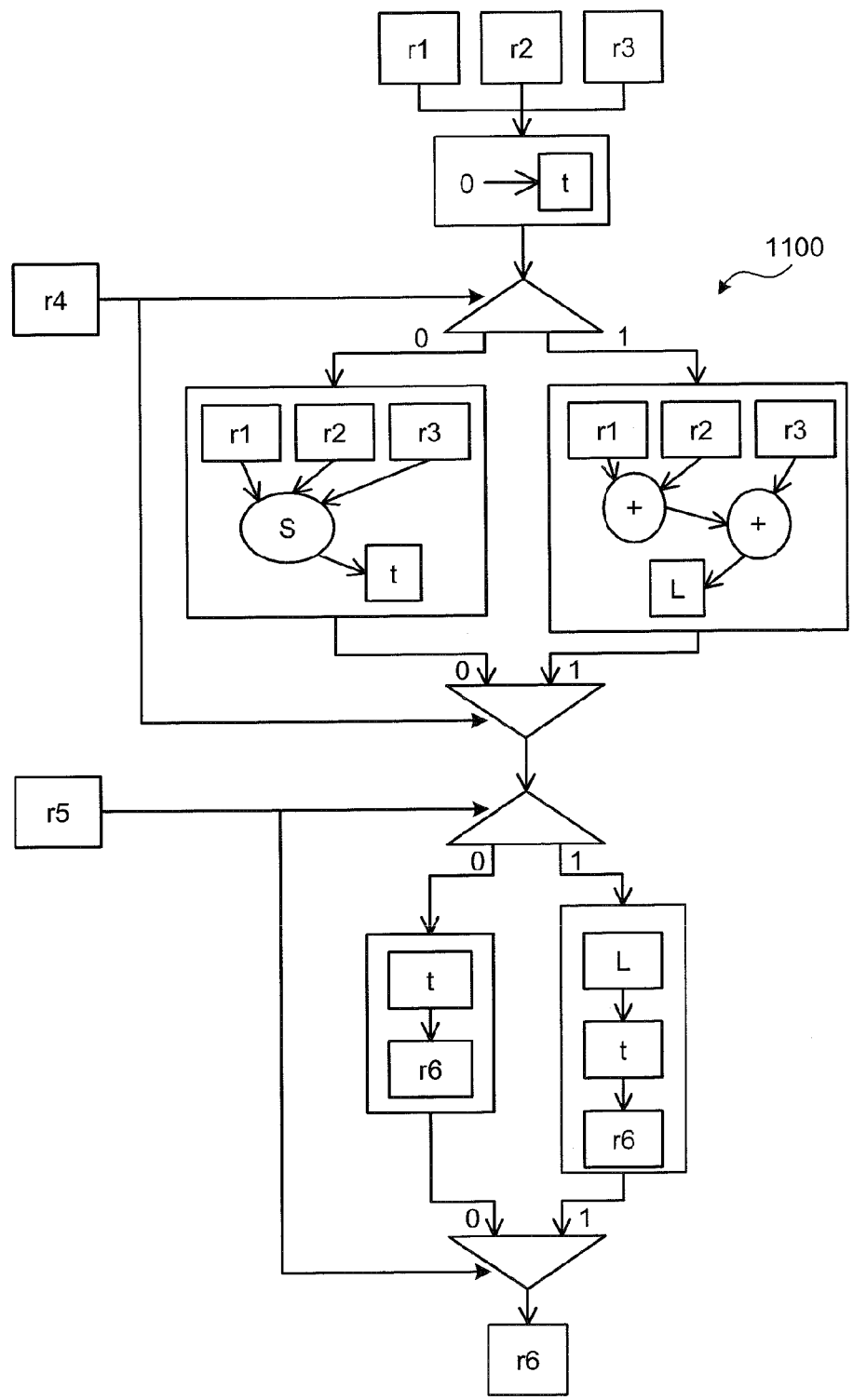
FIG. 11 is a circuit diagram of an exemplary configuration of a CDFG (internal register verification)

The CFG 900 includes five DFGs. FIGS. 10A to 10E are circuit diagrams of the configurations of DFGs 1 to 5 (internal register verification). Registers depicted in FIGS. 10A to 10E are each appended with the following parameters and calculated. The DFG 900 corresponds to the description 802 of FIG. 8. The DFG 1 corresponds to the description 803 of FIG. 8. The DFGs 2, 3, and 4 correspond respectively to the descriptions 804, 805, and 806 depicted in FIG. 8. The DFG 5 corresponds to the descriptions 807 and 808 depicted in FIG. 8.

r1=a, r2=b, r3=c, r4=p1, r5=p2, r6=d
t, L: internal register
+: addition
S: calculation to obtain an area As described above, when a CFG and a DFG are created, a CDFG is further created using the resulting CFG and DFG. FIG. 11 is a circuit diagram of an exemplary configuration of a CDFG (internal register verification). As depicted in FIG. 11, a CDFG 1100 is configured by combining the CFG (see FIG. 9) and the DFG (see FIGS. 10A to 10E). For example, a high-level synthesis technique of creating a circuit from the RTL description may be used as a technique for the creation of the CDFG (see for example, Yusuke Matsunaga, "Basic techniques for high-level synthesis", Proceedings of the Society Conference of The Institute of Electronics, Information and Communication Engineers (IEICE), September 2003).

Figure 12:
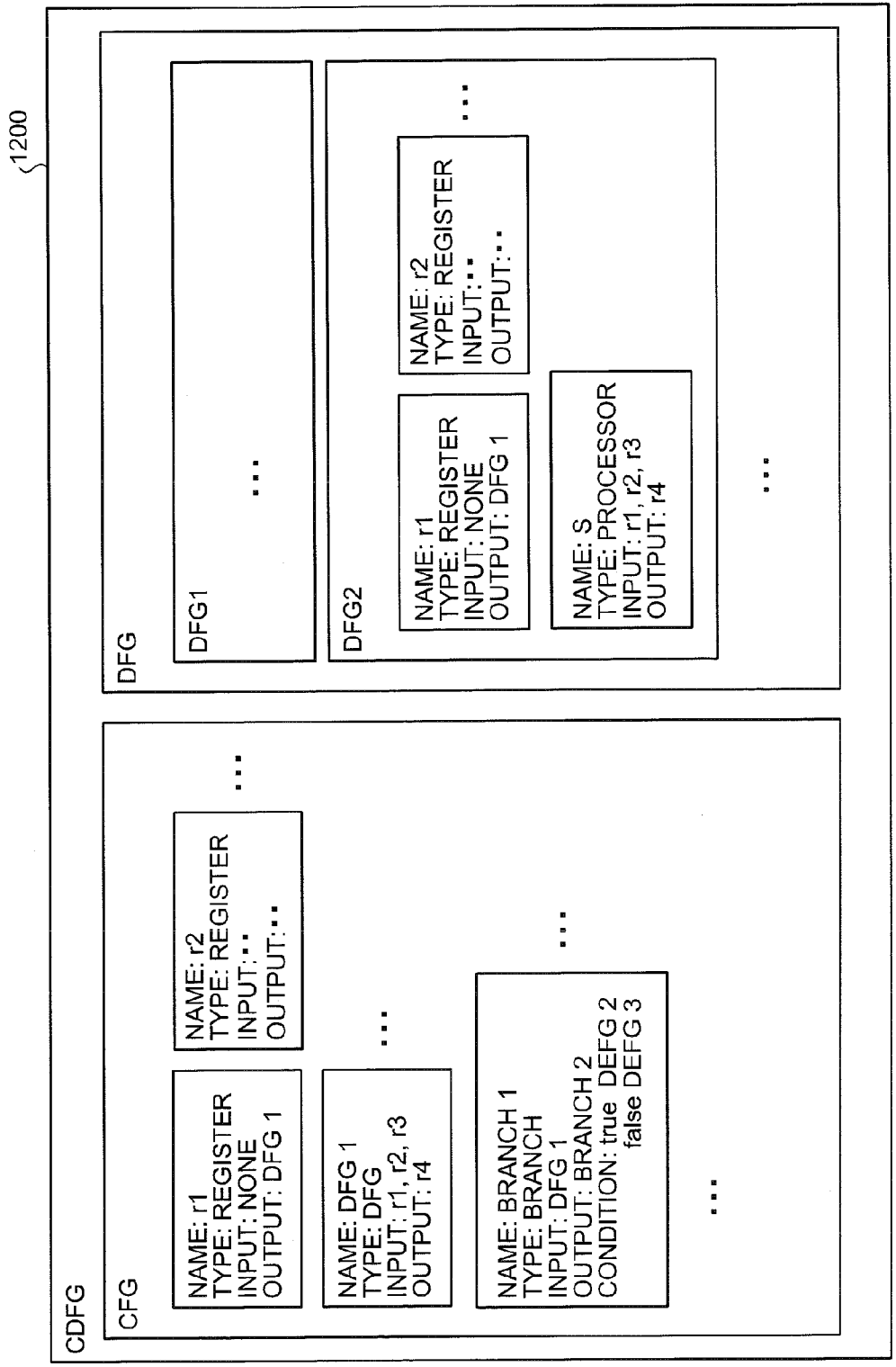
FIG. 12 is a view of a data structure of a CDFG (internal register verification)

FIG. 12 is a view of the data structure of a CDFG (internal register verification). At step S402, data 1200 of the CDFG that corresponds to the input RTL description is finally output. The data 1200 of the CDFG has the data structure depicted in FIG. 12, i.e., a structure that includes, for each CFG, a DFG in a CFG.

Figures 13A, 13B:
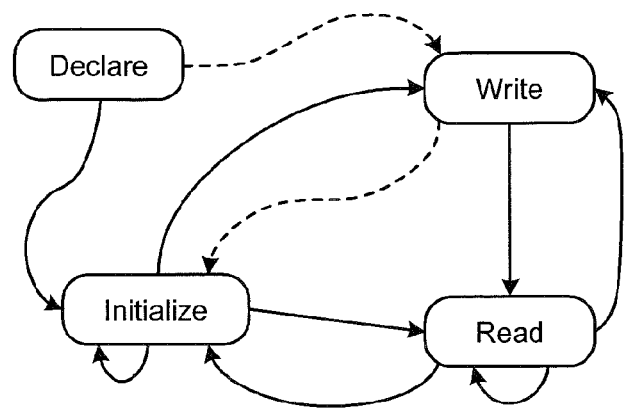
FIG. 13A is a state transition chart of a DIRW matrix (internal register verification)
FIG. 13B is a truth value table depicting the DIRW matrix (internal register verification)

At step S403, the CDF created by the analysis of the implementation description at step S402 and the DIRW matrix are input, and the path that corresponds to the DIRW is output. Description concerning the DIRW matrix will follow. FIG. 13A is a state transition chart of the DIRW matrix (internal register verification). FIG. 13B is a truth value table depicting the DIRW matrix (internal register verification).

The DIRW matrix used in the embodiment is information that is indicative of the state of a path corresponding to the state transition of a register. The state transition chart of FIG. 13A depicts exemplary transitions of the following four states that may actually occur in a register to be verified (in the embodiment, an internal register).

Declare (Definition)
Initialize (Initialization)
Read (Reading)
Write (Writing)

In the state transition chart of FIG. 13A, a transition having a thick-lined arrow (for example, Write→Read) indicates a valid path and a transition having a dotted-lined arrow (for example, Write→Initialization) indicates a path for which the intent of the design needs to be checked. A transition having no arrow indicates a path that is a bug. In the case of the DIRW matrix described in the embodiment, no transition to "Declare" occurs and, therefore, no arrow that represents a transition to "Declare" is present.

A graphical representation of the state transition of FIG. 13A is the truth value table of FIG. 13B. In FIG. 13B, for each of the paths before a transition (before) and the paths after a transition (after), information concerning the validity is set classified into three types. More specifically, the three types include "α" that represents a valid path, "β" that represents a path for which a check of the design intent is needed, and "γ" that represents a path that is a bug.

Figure 14:
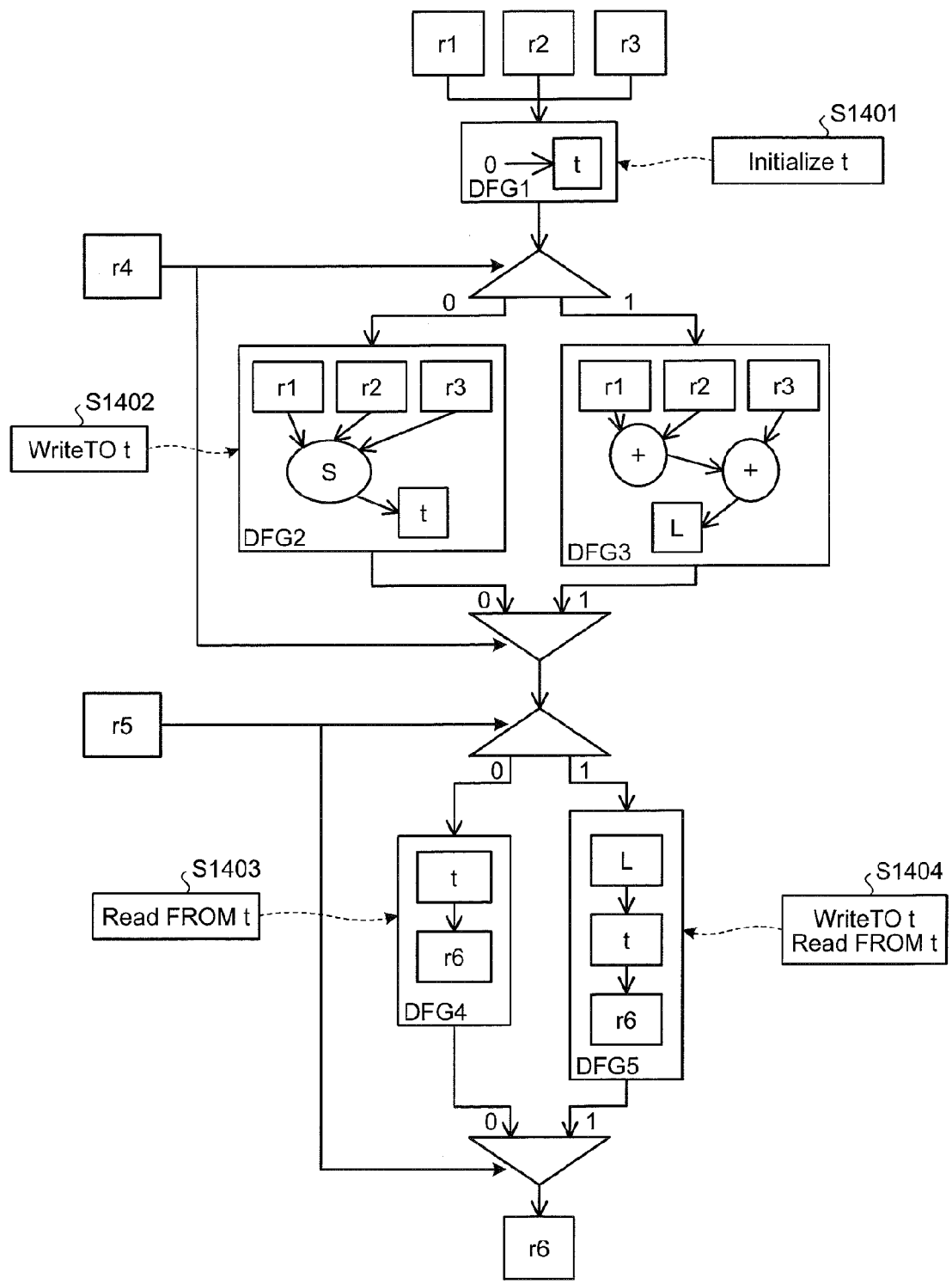
FIG. 14 is a view of a path extracting procedure concerning an internal register t.

At step S403, a path concerning a specific internal register is extracted with reference to the above DIRW matrix. FIG. 14 is a view of a path extracting procedure concerning the internal register t. With reference to FIG. 14, description concerning the path extracting procedure for the internal register t will follow.

In the CDFG created at step S402, positions at which the internal registers t are used include four positions, a DFG 1, a DFG 2, a DFG 4, and a DFG 5. Therefore, the transitions that occur in a path of the internal registers t at the DFGs at the four positions are extracted. Therefore, the following extraction is executed for the internal registers t.

A path that Initializes t of the DFG 1 to "0" (step S1401)
A path that Reads from S of the DFG 2 and Writes to t (step S1402)
A path that Reads from t of the DFG 4 and Writes to r6 (step S1403)
A path that Reads from L of the DFG 5 Writes to t and a path that Reads from t and Writes to r6 (step S1404)

At step S403, for each of the above paths extracted as described, a path is further extracted corresponding to each of the cases (γ, β, and α) of the path.

Figure 15:
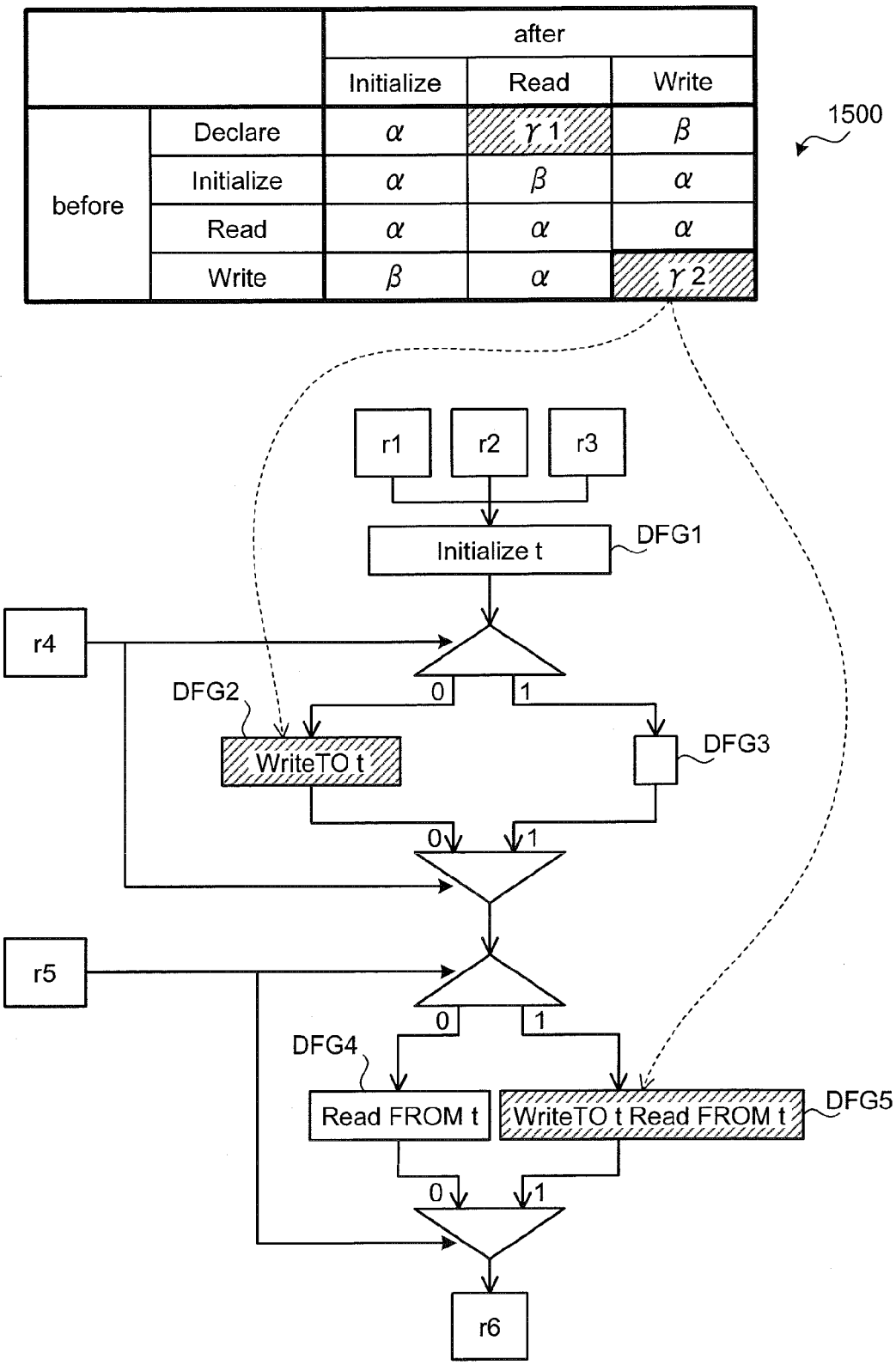
FIG. 15 is a view of an extraction of a path that generates a bug (internal register verification)

FIG. 15 is a view of the extraction of a path that generates a bug (internal register verification). As indicated in a truth value table 1500 depicted in FIG. 15, paths that each generate a bug include "Declare"→"Read" (γ1) and "Write"→"Write" (γ2). Of these two paths, the path of "Write"→"Write" (γ2) is present in both the DFG 2 and the DFG 5 and this path is extracted as a path that generates a bug (γ).

Figure 16:
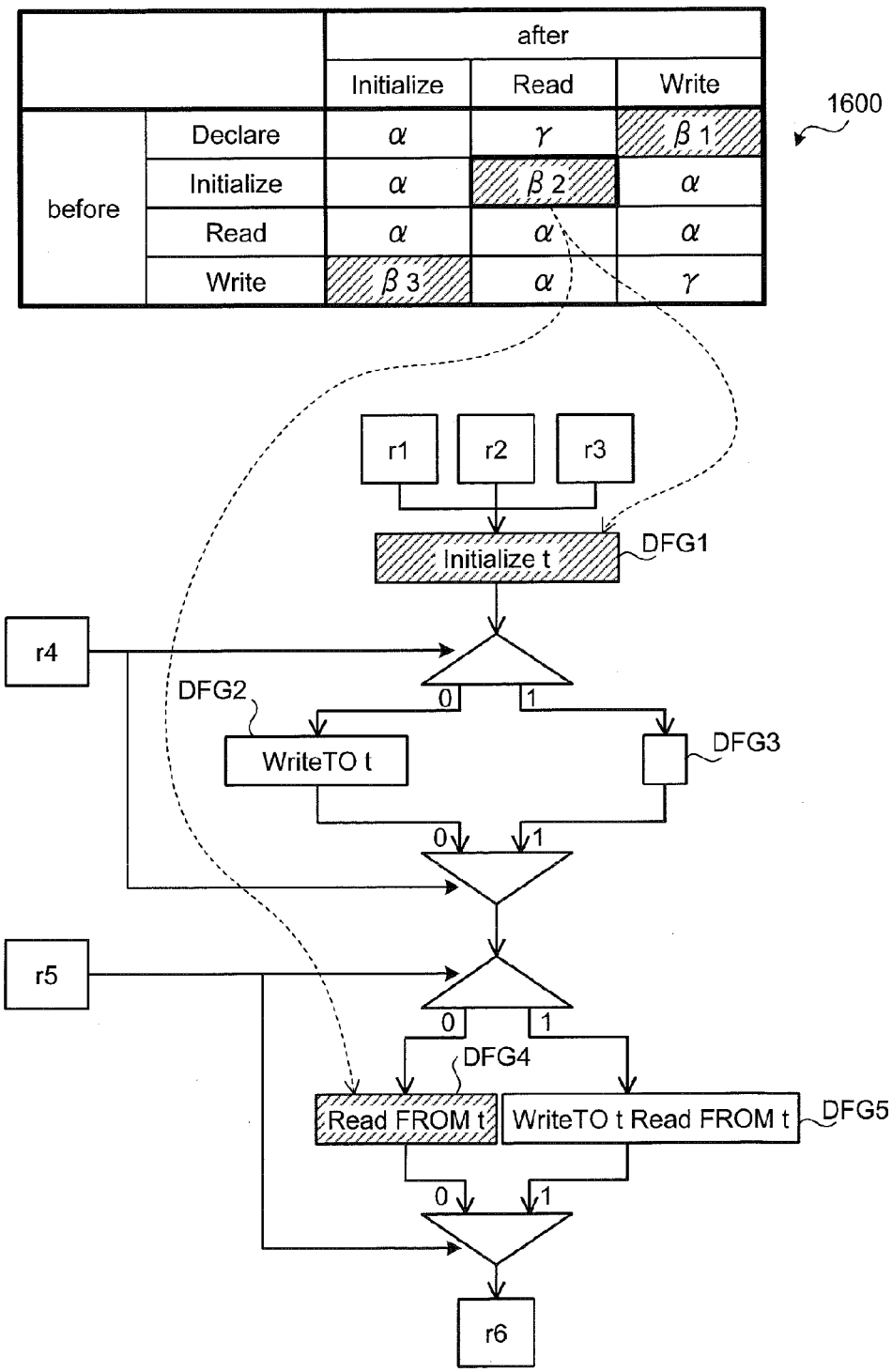
FIG. 16 is a view of an extraction of a path for which a check of the design intent is needed (internal register verification)

FIG. 16 is a view of the extraction of a path for which a check of the design intent is needed (internal register verification). As indicated in a truth value table 1600 depicted in FIG. 16, paths for which the check is needed include "Declare"→"Write" (β1), "Initialize"→"Read" (β2), and "Write"→"Initialize" (β3). Of these three paths, the path of "Initialize"→"Read" (β2) is present in each of the DFG1 and the DFG 4 and these paths are extracted as the paths for which the check is needed (β).

Figure 17:
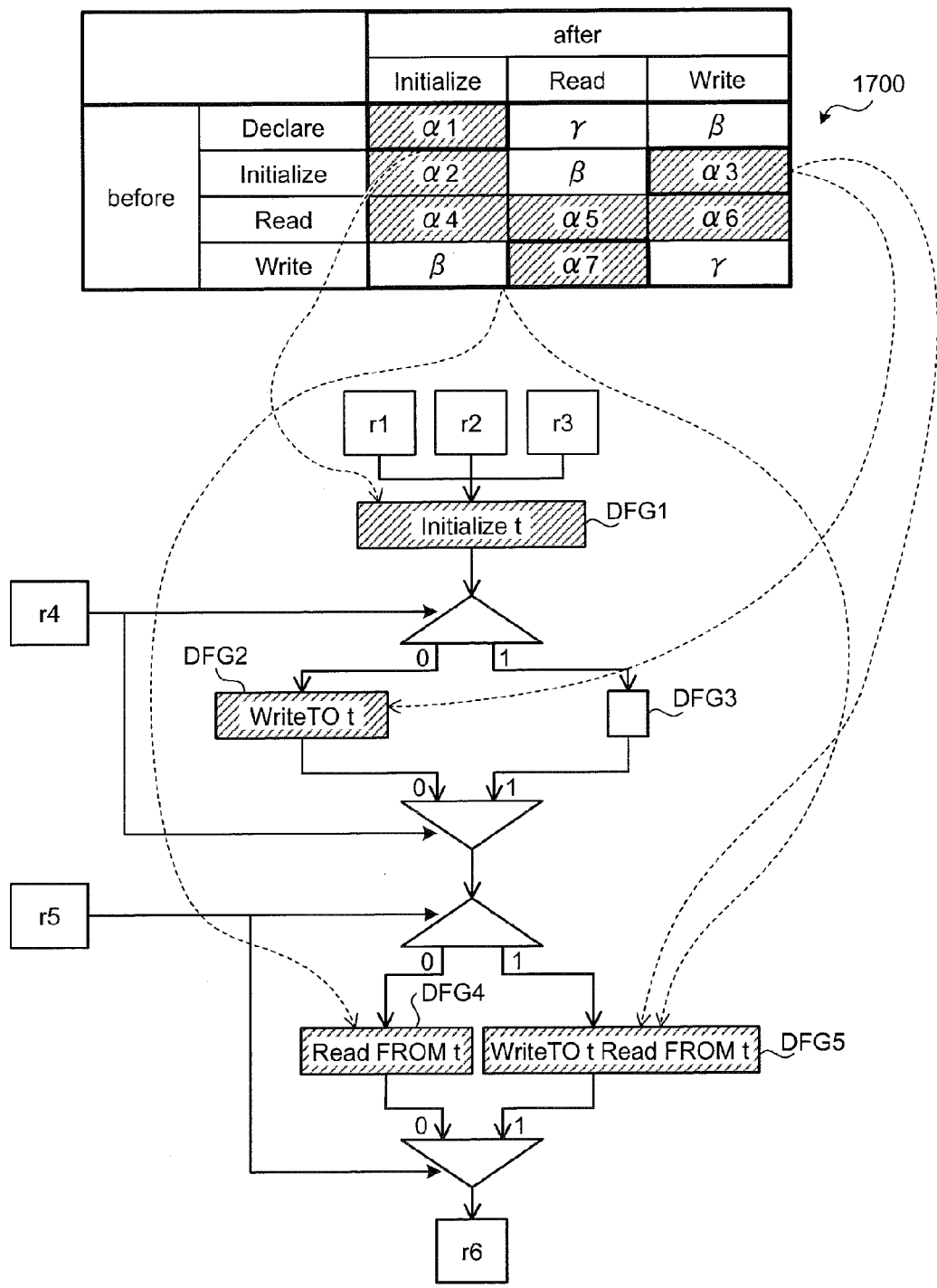
FIG. 17 is a view of an extraction of valid paths (internal register verification)

FIG. 17 is a view of the extraction of valid paths (internal register verification). As indicated in a truth value table 1700 depicted in FIG. 17, the valid paths are the seven paths exclusive of the above five paths (γ1, γ2, and β1 to β3). Of these seven paths: the path of "Declare"→"Initialize" (α1) and the path of "Initialize"→"Write" (α3) are present in the DFG 1; and the path of "Initialize"→"Write" (α3) and the path of "Write"→"Read" (α7) are present in the DFG 2; the path of "Write"→"Read" (α7) is present in the DFG 4; and the path of "Initialize"→"Write" (α3) and the path of "Write"→"Read" (α7) are present in the DFG 5. These paths are extracted as the normal (α) paths.

As described above, step S403 enables detection of all of the paths of the registers to be verified (in the example above, the internal register t) utilizing the DIRW matrix. As indicated by the determination, at step S404, of whether the processing for all the registers has been completed, the path extraction at step S403 is sequentially executed for each of the registers to be verified. Therefore, for the circuit 100 to be verified, the above path extraction is also executed to the internal register L because the internal register L is present in addition to the internal register t.

Figure 18:
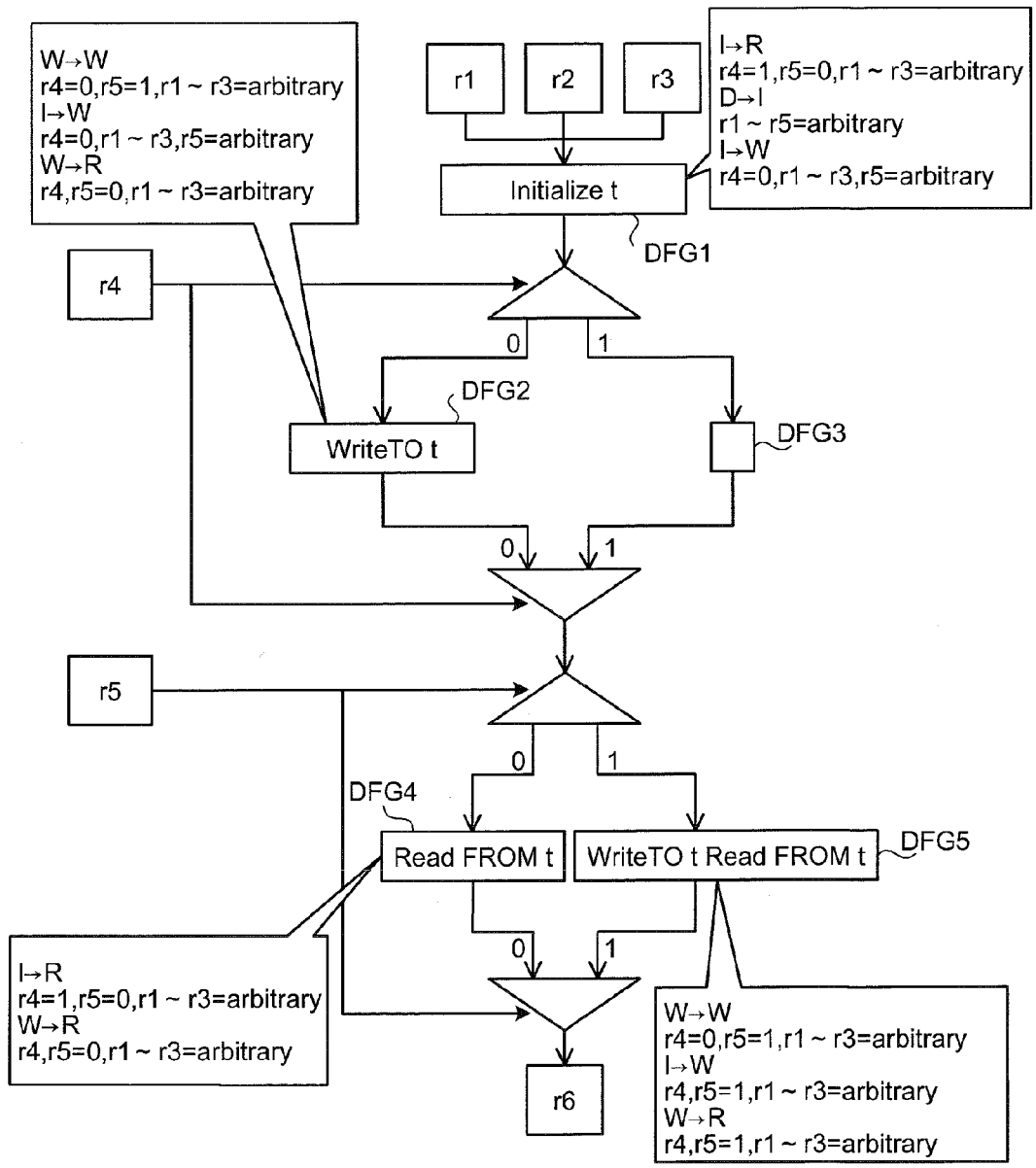
FIG. 18 is a view of a parameter calculation procedure (internal register verification)

At step S406, the CDFG created by analyzing the implementation description at step S402, and a path that corresponds to the DIRW extracted at steps 404 and 405 are input. At step S405, a value that can be substituted as a parameter is calculated using the information input. FIG. 18 is a view of the parameter calculation procedure (internal register verification). In FIG. 18, a value that can be substituted as the parameter concerning the internal register t is calculated. However, thereafter, parameters concerning the other internal registers (for example, the internal register L) are sequentially calculated.

As depicted in FIG. 18, for example, for the DFG 1, calculation of a parameter concerning I (Initialize)→R (Read), calculation of a parameter concerning D (Declare)→I (Initialize), and calculation of a parameter concerning I (Initialize)→W (Write) are executed. When the parameters are calculated, the parameters are obtained by substituting a specific value or an arbitrary value is substituted classified for the case of each of the control conditions. For a register for which an arbitrary value is taken, a value corresponding to the control condition described in the CDFG is substituted.

Processing identical to that for the DFG 1 is also executed for the DFGs 2 and 5. The calculation of the parameters at step S405 becomes more complicated corresponding to the number of paths to be verified. However, using an existing calculation application such as "Solver" or "Mathematica" enables easy implementation of the calculation. The created parameters are used in the creation of a verification scenario having a parameter at the next step S406.

FIG. 19 is a chart of an exemplary output of a verification scenario having a parameter set (internal register verification). At step S406, the verification scenario whose scope of execution is identified at step S401 and the parameter calculated at step S405 are input. The parameter is set in the verification scenario and this scenario is output as a verification scenario with a parameter 1900.

Description will follow concerning verification of the internal registers that appear only in the implementation. For the verification of the implementation-dependent register, as described above, work for extracting the implementation-dependent register is necessary. Therefore, description follows concerning the creating procedure of the verification scenario that includes the extraction of the implementation-dependent register. Though only the items iv) the DIRW matrix and iii) the implementation information of hardware (example including the implementation-dependent registers) that are different from those for the internal register verification are used in the following description, other input information items (i) the verification scenario, ii) the list of the registers to be verified) that are the same is used.

FIG. 20 is a flowchart of the creating procedure of the verification scenario for the implementation-dependent register to be verified. As depicted in FIG. 20, items i) to iii) are input first and, thereby, the scope of execution of the verification scenario is identified (step S2001) and the implementation description is analyzed (step S2002). Subsequently, a process of extracting the implementation-dependent registers (2000) is executed.

The register list of the registers described in the DFG is created from the implementation (step S2003). The register list created at step S2003 is compared with item ii) the list of the registers to be verified that is input at step S2001 (step S2004) and the implementation-dependent registers are extracted. Thereafter, a path is extracted for the implementation-dependent registers (step S2005), whether the processing for all the registers to be verified (implementation-dependent registers) has been completed is determined (step S2006), and the process of extracting a path is repeated until the processing for all the registers has been completed (step S2006: NO). When the processing for all the registers has been completed (step S2006: YES), the parameter value is calculated (step S2007), the verification scenario having a parameter is created (step S2008), and the series of process steps comes to an end. Description will follow concerning the content of the process at each step, together with the input information.

At step S2001, information of the RTL description of the entire system, the verification scenario for the entire system, and the register list for the entire system is input (corresponding to the items i) to iii)). FIG. 21 is a view of an exemplary description of the RTL description including the implementation-dependent registers. FIG. 21 is an example of the RTL description that includes the implementation-dependent registers, and a description 2101 in an RTL description 2100 is a description that indicates the implementation-dependent registers.

When the above information is input, at step 2001, the scope within which the verification is executed according to the verification scenario 600 is extracted from the entire RTL description 2100. Therefore, after the processing at step S2001, the RT1 description concerning the identified scope, the verification scenario, and the register list are output.

At step S2002, the RTL description whose scope of execution has been identified at step S2001 (see FIG. 21) and the register list (see FIG. 7) are input. The CFG representative of the flow of the control and the DFG representative of the flow of the data are created from the input RTL description.

Figure 22:
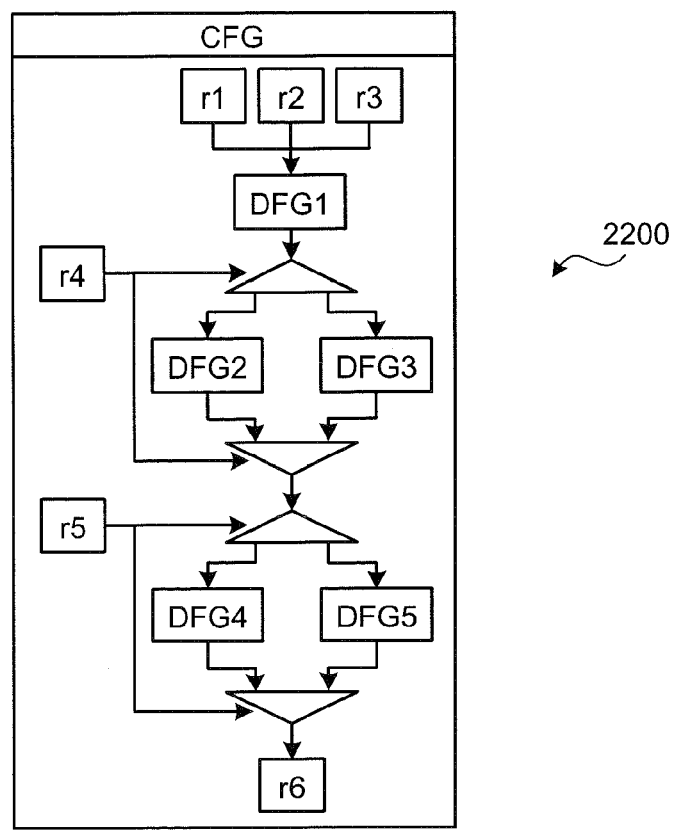
FIG. 22 is a circuit diagram of an exemplary configuration of a CFG (implementation-dependent registers)
Figure 23A:
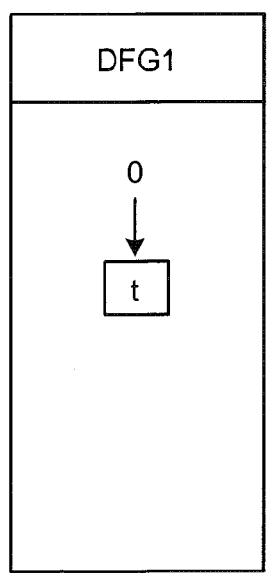
FIGS. 23A to 23E are circuit diagrams of the DFGs 1 to 5, respectively (implementation-dependent registers)
Figure 23B:
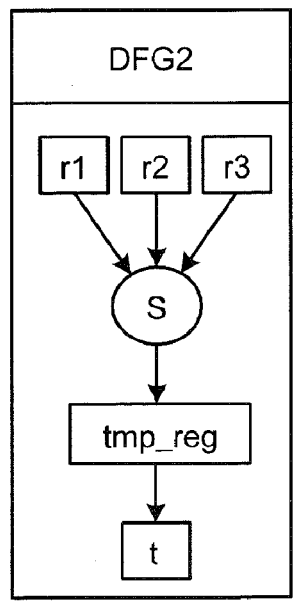
Figure 23C:
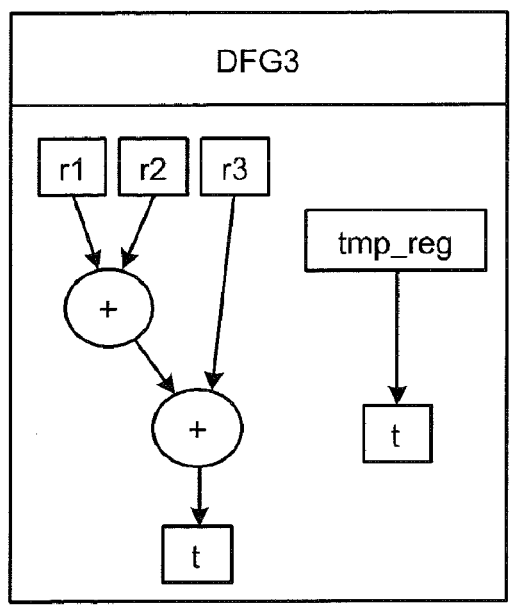
Figure 23D:
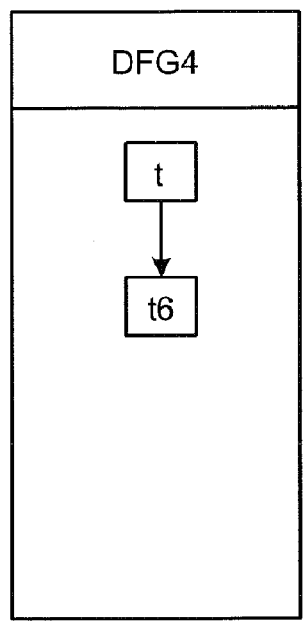
Figure 23E:
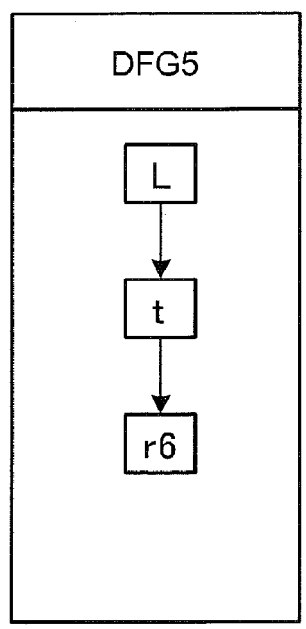

FIG. 22 is a circuit diagram of an exemplary configuration of the CFG (implementation-dependent registers). FIGS. 23A to 23E are circuit diagrams of the DFGs 1 to 5, respectively (implementation-dependent registers). A parameter is appended to and calculation is executed for each of the registers depicted in FIGS. 23A to 23E, similarly to the verification concerning the internal registers. A DFG 2200 corresponds to a description 2102 depicted in FIG. 21. The DFG 1 corresponds to a description 2103 depicted in FIG. 21. The DFG 2 corresponds to a description 2104 depicted in FIG. 21. The DFG 3 corresponds to a description 2105 depicted in FIG. 21. The DFG 4 corresponds to a description 2106 depicted in FIG. 21. The DFG 5 corresponds to a description 2107 depicted in FIG. 21. When the CFG and the DFG are created, the CDFG is further created using the creation result.

Figure 24:
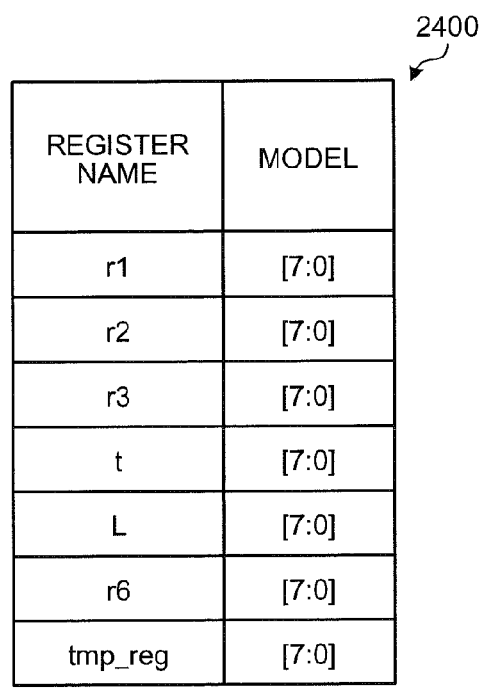
FIG. 24 is a chart of the creation of the register list concerning the DFG.

At step S2003, the CDFG created at step S2002 is input, and the register list that indicates the registers implemented in the circuit 100 to be verified is created from the input CDFG. FIG. 24 is a chart of the creation of the register list concerning the DFG. As depicted in FIG. 24, a register list 2400 has a configuration different from that of the register list 700 (see FIG. 7) indicating the registers included in the specifications because the list 2400 is created from the description of the CDFG.

At step S2004, the register list that indicates the implemented registers and is created at step S2003 is compared with the register list of item ii) registers to be verified input at step S2001, and the implementation-dependent registers are extracted.

Figure 25:
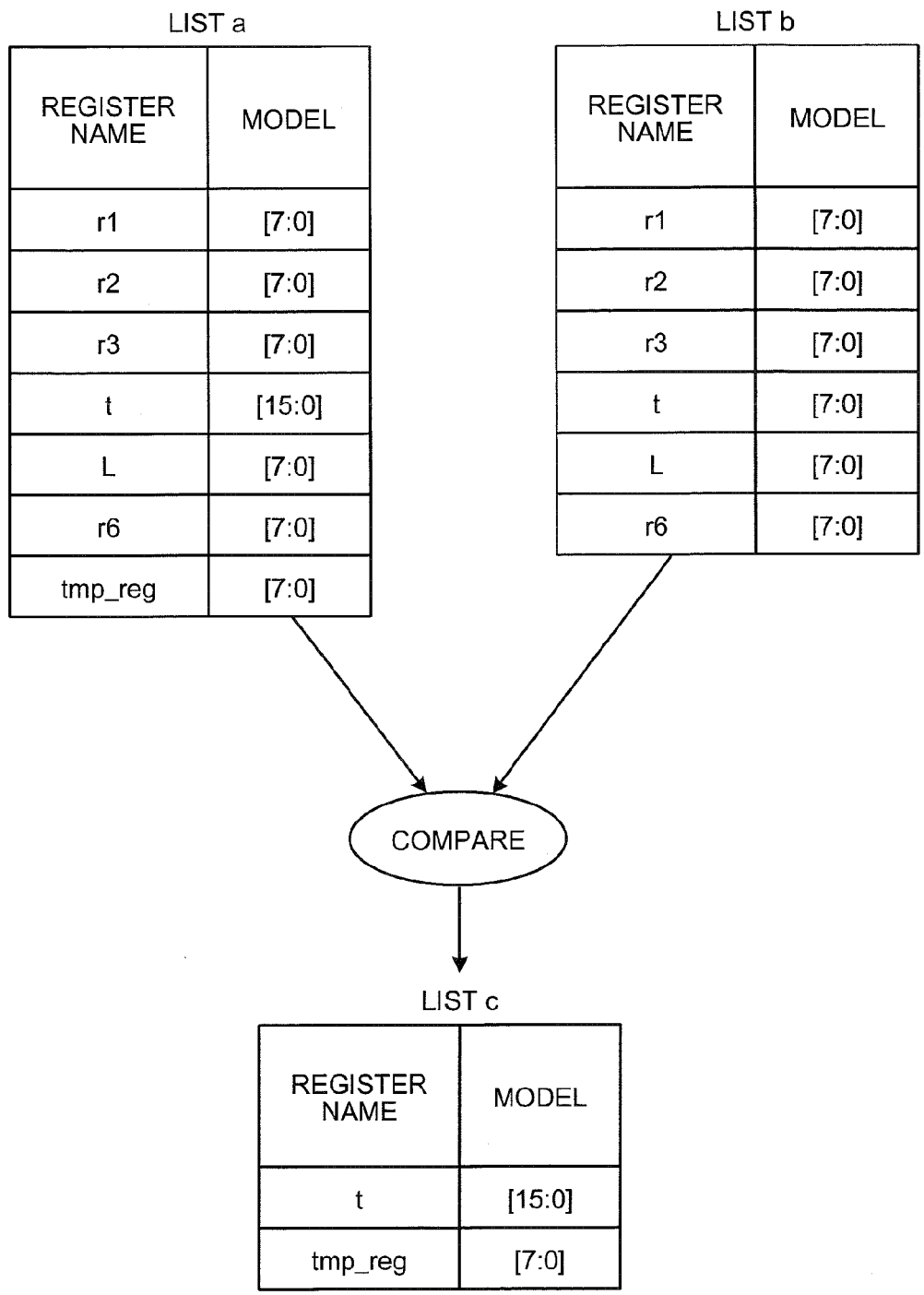
FIG. 25 is a view of a procedure of comparison of register lists.

FIG. 25 is a view of the procedure of the comparison of the register lists. In FIG. 25, a list "a" indicates the implemented registers. A list "b" is a register list of item ii) registers to be verified. These two lists are compared with each other, and the registers that are not found in both lists are extracted from the list "a". The registers that are not simultaneously found in both lists include not only the registers included only in one of the register lists (for example, a register tmp_reg) but also the registers having different attributes such as the model or the type among the compared registers (for example, the register t).

Therefore, step S2003 enables the creation of an implementation-dependent register list that corresponds to the implementation of the circuit 100 to be verified. FIG. 26 is a chart of the implementation-dependent-register list. A register list 2600 depicted in FIG. 26 is a list that covers the implementation-dependent registers and the registers included in the specifications. The attribute for the implementation is reflected on a register that has different attributes for the implementation and the specifications. The implementation-dependent registers are extracted by referring to the register list 2600. A dedicated flag may be appended to each of the implementation-dependent registers in the register list 2600 to facilitate extraction.

Figures 27A, 27B:
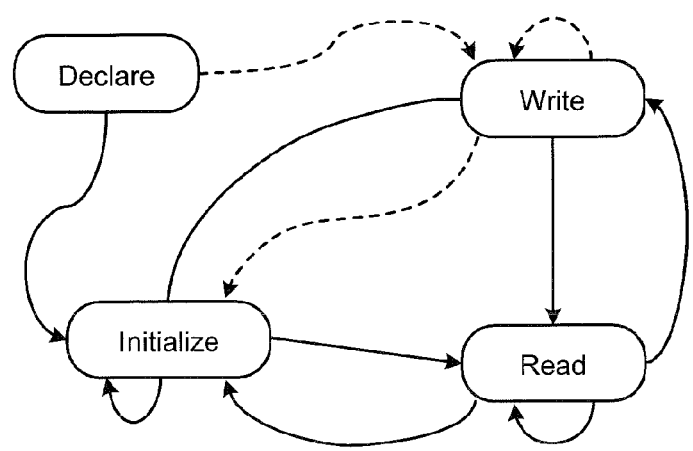
FIG. 27A is a state transition chart of the DIRW matrix (implementation-dependent register verification)
FIG. 27B is a truth value table of the DIRW matrix (implementation-dependent register verification)

At step S2005, the CDFG created by the analysis of the implementation description at step S2002, the DIRW matrix, and the implementation-dependent registers extracted at step S2004 are input and a path that corresponds to the DIRW is output. FIG. 27A is a state transition chart of the DIRW matrix (implementation-dependent register verification). FIG. 27B is a truth value table of the DIRW matrix (implementation-dependent register verification). The DIRW matrix has a setting that includes different validities concerning the path of W (Write)→W (Write) from that of FIGS. 13A and 13B.

FIG. 28 is a view of the procedure of extracting a path concerning an implementation-dependent register tmp_reg. In the created CDFG, the positions at which implementation-dependent registers tmp_reg are used include two positions, the DFGs 2 and 3. Therefore, regardless of the transitions that occur in the path of the implementation-dependent registers tmp_reg in these two DFGs, paths are extracted. Therefore, for the implementation-dependent registers tmp_reg, the extraction as follows is executed.

A path that Reads from S of the DFG 2 and Writes to the tmp_reg (step S2801)

A path that Reads from the tmp_reg of the DFG 2 and Writes to t (step S2801)

A path that Reads from the tmp_reg of the DFG 3 and Writes to t (step S2802)

At step S2005, a path is further extracted corresponding to each of the cases (γ, β, α) of the above path classification, for the path extracted as described above.

Figure 29:
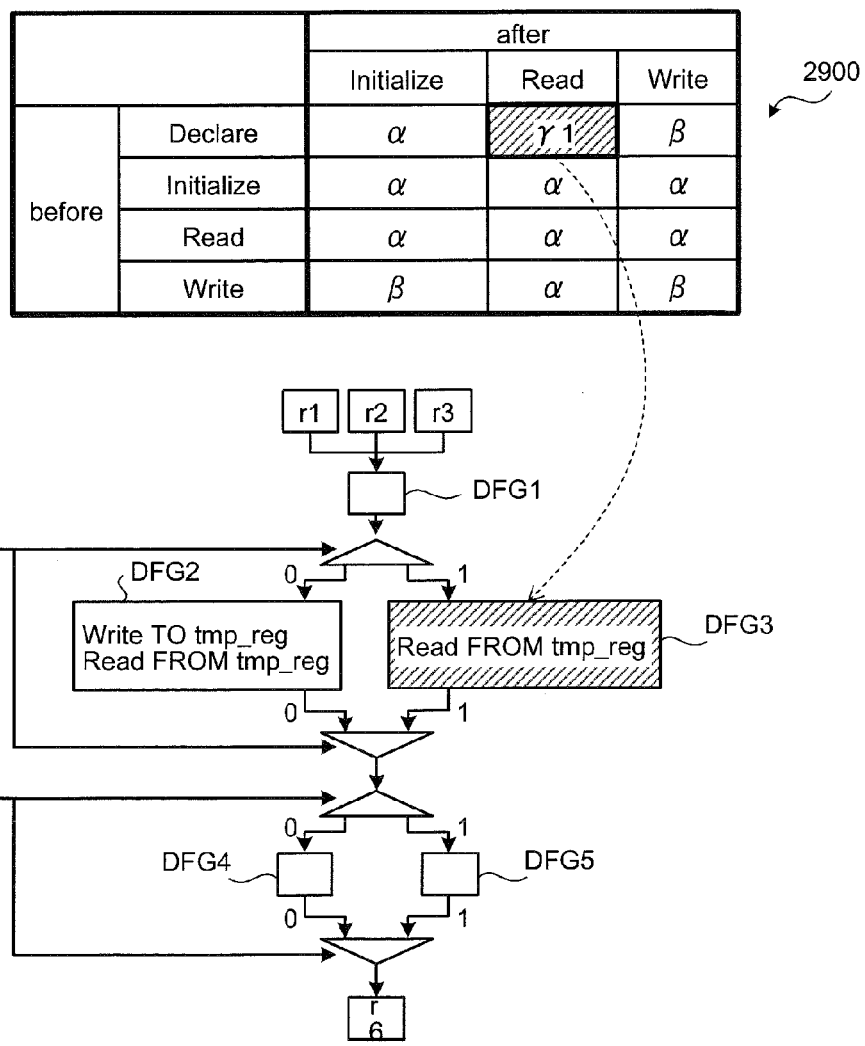
FIG. 29 is a view of an extraction of a path that generates bugs (implementation-dependent register verification)

FIG. 29 is a view of the extraction of a path that generates bugs (implementation-dependent register verification). As indicated in a truth value table 2900 depicted in FIG. 29, a path of "Declare"→"Read" (γ1) is present as the path that generates a bug and this transition is present in the path of the DFG 3. Therefore, this path is extracted as a path that generates a bug (γ).

Figure 30:
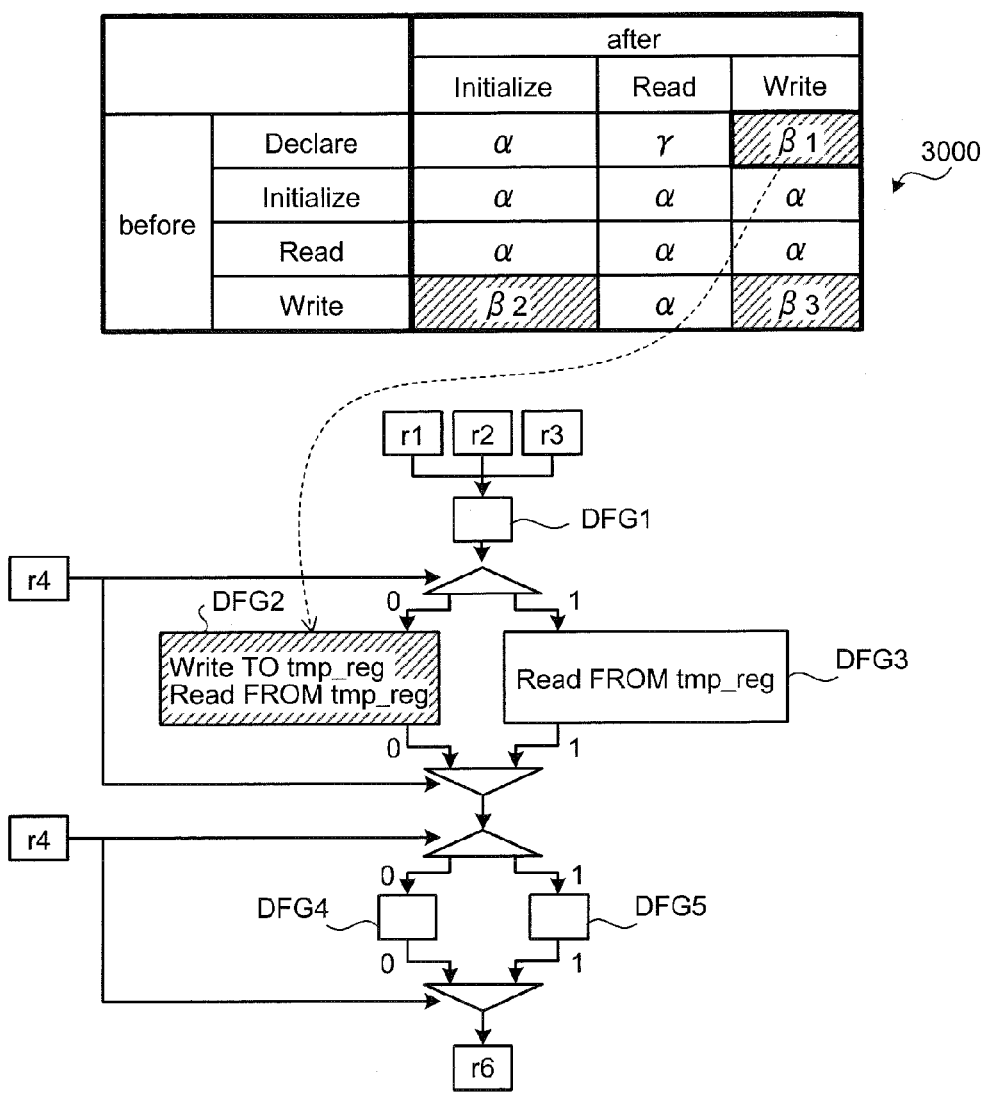
FIG. 30 is a view of an extraction of the path for which a check of the design intent is needed (implementation-dependent register verification)

FIG. 30 is a view of the extraction of the path for which a check of the design intent is needed (implementation-dependent register verification). As indicated in a truth value table 3000 depicted in FIG. 30, the paths of "Declare"→"Write" (β1), "Write"→"Initialize" (β2), and "Write"→"Write" (β3) are present as paths for which the check is needed. Of these three paths, the path in the DFG 2 is extracted as a path for which the check is needed (β).

Figure 31:
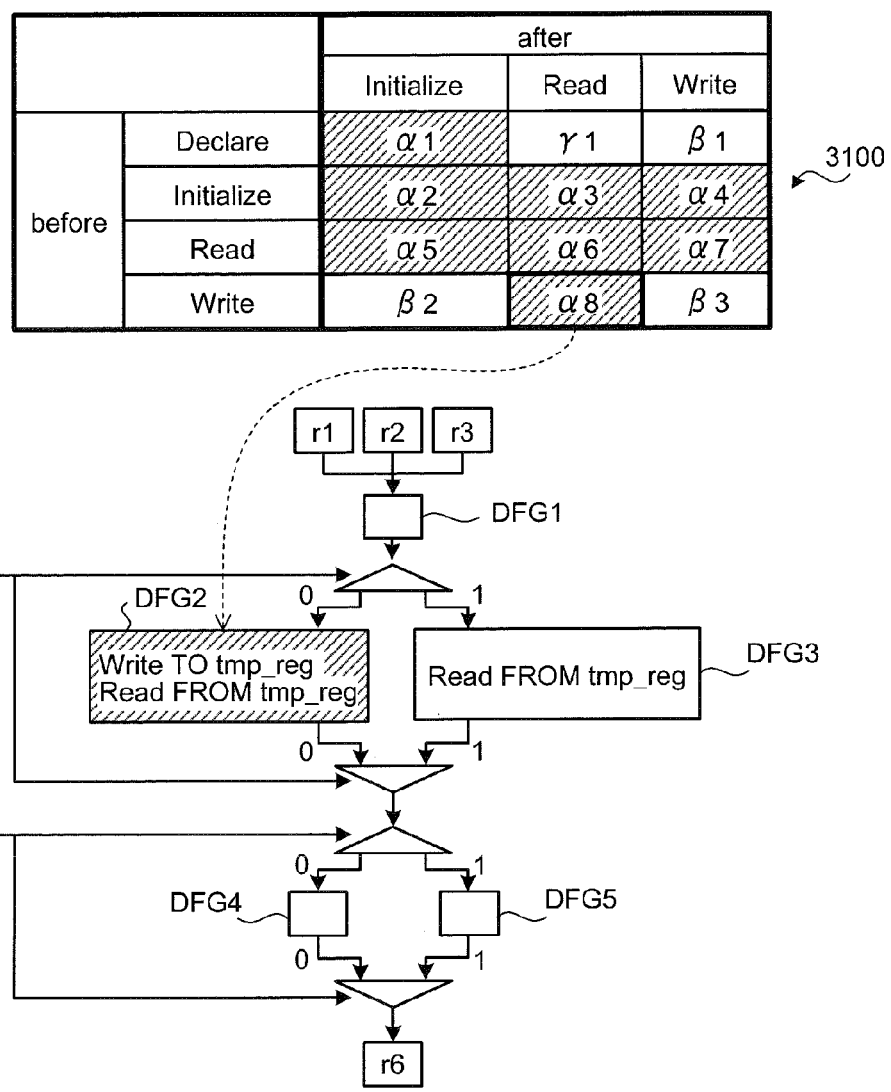
FIG. 31 is a view of an extraction of a valid path (implementation-dependent register verification)

FIG. 31 is a view of the extraction of a valid path (implementation-dependent register verification). As indicated in a truth value table 3100 depicted in FIG. 31, concerning valid paths, eight paths exclusive of the above four paths (γ and β1 to 3) are valid paths. Of these eight paths, the path in the DFG 2 is extracted as a valid path (α).

In this manner, step S2005 enables the detection of all the paths of the registers to be verified (in the above example, the implementation-dependent registers tmp_reg) using the DIRW matrix.

Figure 32:
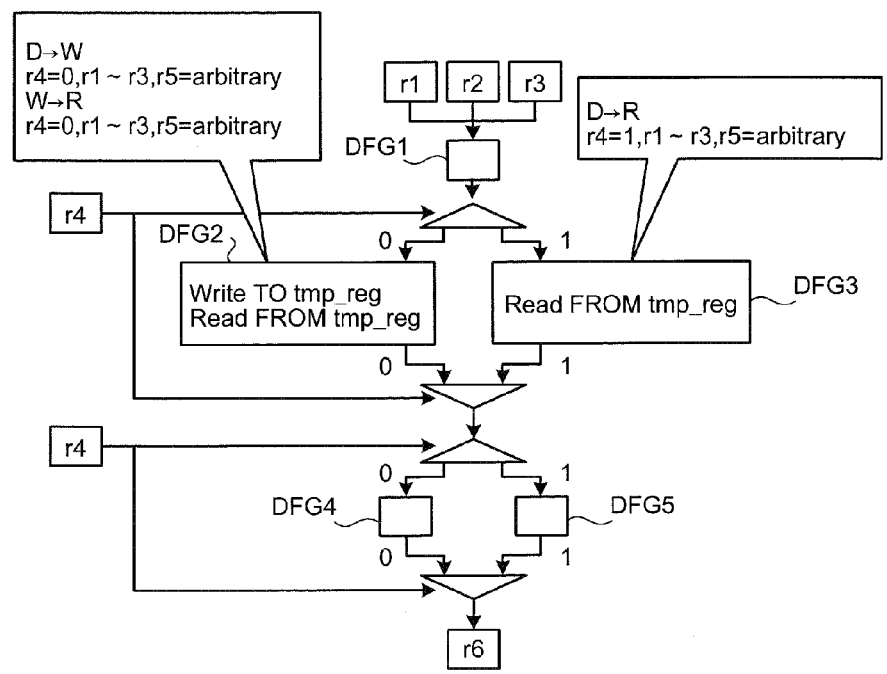
FIG. 32 is a view of a procedure of calculating the parameter (implementation-dependent register verification)

At step S2007, the CDFG created by the analysis of the implementation description at step S2002, and a path that corresponds to the DIRW extracted at steps S2005 and 2006 is input. At step S2007, a value that may be substituted as a parameter is calculated using the information input. FIG. 32 is a view of the procedure of calculating the parameter (implementation-dependent register verification). As depicted in FIG. 32, a value is calculated that may be substituted as a parameter concerning the implementation-dependent register tmp_reg. However, thereafter, parameters concerning other implementation-dependent registers (for example, the implementation-dependent register t) are sequentially calculated.

As depicted in FIG. 32, for example, in DFG 2, calculation of a parameter concerning the D (Declare)→W (Write) and calculation of a parameter concerning the D (Declare)→R (Read) are executed. Similarly, in DFG 3, calculation of a parameter concerning the D (Declare)→R (Read) is executed.

FIG. 33 is a chart of an exemplary output of a verification scenario having a parameter set (implementation-dependent register). At step S2008, the verification scenario whose scope of execution is identified at step S2001, and the parameters calculated at step S2007 are input. A parameter is set in the verification scenario and this scenario is output as a verification scenario 3300 having a parameter as depicted in FIG. 33.

Figure 34:
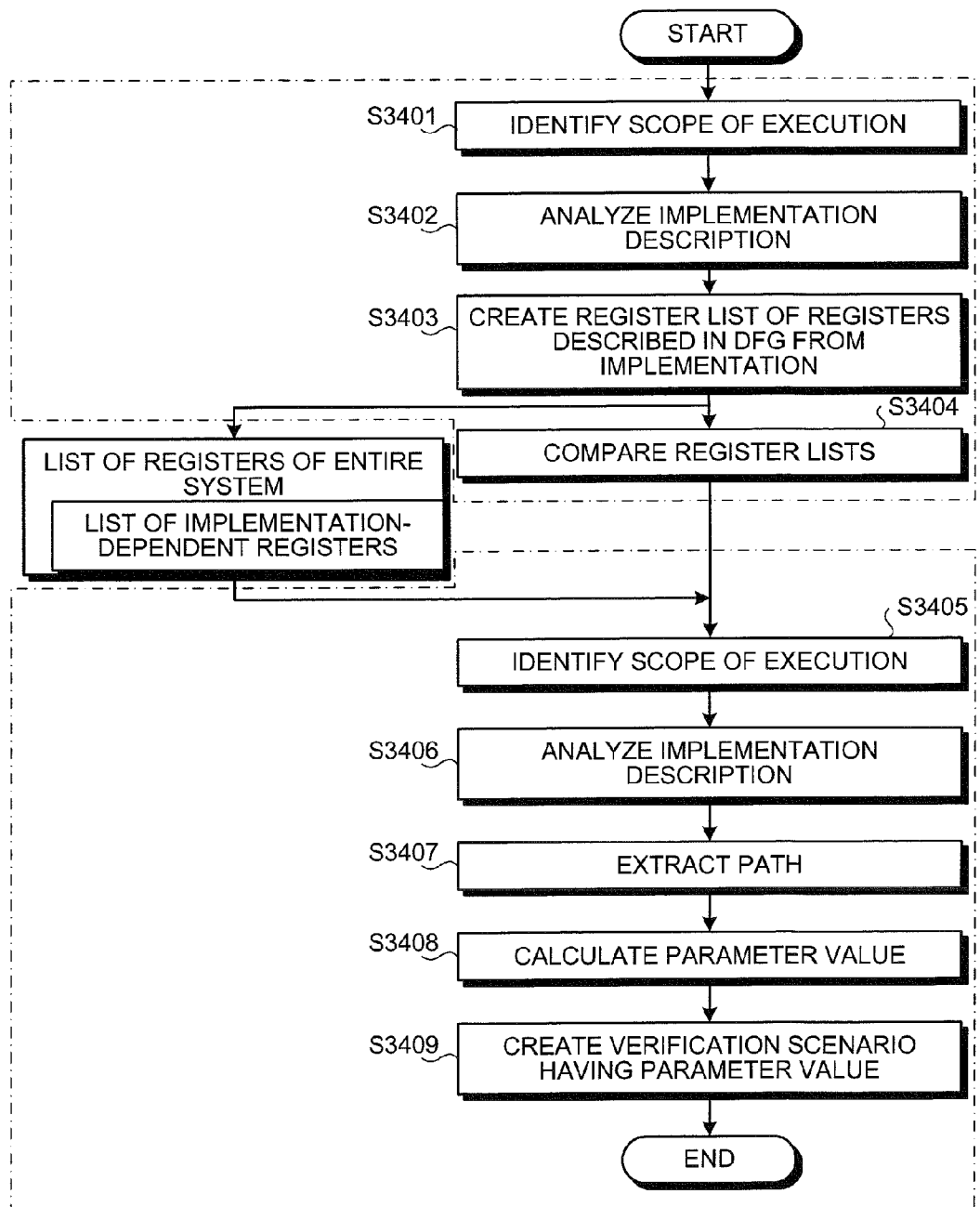
FIG. 34 is a flowchart of a procedure of creating the verification scenario for both the internal registers and the implementation-dependent registers to be verified.

Although the process for the case where the internal registers are handled and the process for the case where the implementation-dependent registers are handled, are each handled as an independent process in the above description of the procedure of creating the verification scenario having a parameter, those processes may be handled as a series of processes. FIG. 34 is a flowchart of the procedure of creating the verification scenario for both the internal registers and the implementation-dependent registers to be verified.

According to the flowchart depicted in FIG. 34, after the implementation-dependent registers are extracted by the processes at steps S3401 to S3404, a verification scenario can be created having a parameter that verifies arbitrary registers to be verified (registers designated among the internal registers and the implementation-dependent registers) at steps S3405 to S3408 (step S3409).

As described above, the embodiment extracts a path to be verified that is necessary for verifying a register to be verified. The embodiment enables creation of a verification scenario having a parameter to execute comprehensive verification that takes into account the validity of the extracted path. Executing the verification of the circuit 100 to be verified using the above verification scenario having a parameter set enables improvement of the verification efficiency.

Furthermore, a verification scenario can be created that covers a path to be verified of an internal register that is externally inaccessible and among the registers included in the circuit to be verified.

A verification scenario cab be created that covers the path to be verified of the implementation-dependent register that is implemented depending on the configuration for the implementation and that is among the registers included in the circuit to be verified.

According to the embodiments the verification precision for a register to be verified can be improved.

The embodiments realize support for verification of hardware to be verified through the creation of a verification scenario that has a comprehensive parameter set therein, to verify a specific register that is designated by a user.

The verification supporting method explained in the present embodiment can be implemented by a computer, such as a personal computer and a workstation, executing a program that is prepared in advance. The program is recorded on a computer-readable recording medium such as a hard disk, a flexible disk, a CD-ROM, an MO, and a DVD, and is executed by being read out from the recording medium by a computer. The program can be a transmission medium that can be distributed through a network such as the Internet.

The verification supporting apparatus 200 described in the embodiments can be realized by an application specific integrated circuit (ASIC) such as a standard cell or a structured ASIC or a programmable logic device (PLD) such as a field-programmable gate array (FPGA). Specifically, for example, the functions (the recording unit 301 to the register extracting unit 310) of the verification supporting apparatus 200 are defined in hardware description language (HDL), which is logically synthesized and applied to the ASIC, the PLD, etc., thereby enabling fabrication of the verification supporting apparatus 200.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A non-transitory computer-readable recording medium storing therein a verification supporting program that causes a computer to execute:

recording in a memory, a DIRW matrix in which, among four states including Declare, Initialize, Read, and Write, a state transition that has a possibility of occurring in a register included in a circuit to be verified and information concerning validity of a path corresponding to the state transition are set;

acquiring implementation information of the circuit to be verified, a verification scenario that is representative of contents of verification for the circuit to be verified, and a register list that indicates attributes of registers included in specifications of the circuit to be verified;

creating, from the implementation information and the register list acquired at the acquiring, a control data flow graph that includes a control flow graph having a flow of control for implementation of the circuit to be verified described therein and further having a data flow graph written therein, the data flow graph having a flow of data in the control flow graph described therein;

extracting, from the control data flow graph created at the creating, a data flow graph that has described therein a register;

extracting, from the data flow graph extracted at the extracting the data flow graph, a path indicating the flow of data concerning the register;

identifying, based on the data flow graph, the state transition of the path extracted at the extracting the path;

determining whether the state transition identified at the identifying is set in the DIRW matrix;

calculating, if at the determining, the state transition of the path has been determined to be set in the DIRW matrix, a value that can be substituted as a parameter in the register connected to the path, the verification scenario acquired at the acquiring and the control data flow graph being used in the calculating; and creating a verification scenario having a parameter that is obtained by setting the value calculated at the calculating in the verification scenario.

2. The non-transitory computer-readable recording medium according to claim 1, wherein the extracting the data flow graph includes extracting a data flow graph that has described therein an internal register that is inaccessible from outside the circuit to be verified and is among the registers included in the circuit to be verified, the extracting the path includes extracting a path indicating the flow of data concerning the internal register, and the calculating includes calculating, if at the determining, the state transition of the path has been determined to be set in the DIRW matrix, a value that can be substituted as a parameter in the internal register connected to the path, the verification scenario acquired at the acquiring and the control data flow graph being used in the calculating.

3. The non-transitory computer-readable recording medium according to claim 2, wherein the creating the control data flow graph includes creating, from the implementation information and the register list, the control data flow graph of the circuit to be verified, if at the acquiring, a verification scenario verifying a limited scope in the circuit, the implementation information, and the register list are acquired, and the calculating includes calculating the parameter using the verification scenario for which the scope to be verified is limited and the control data flow graph.

4. The non-transitory computer-readable recording medium according to claim 2, wherein the extracting the data flow graph includes extracting, from the control data flow graph created at the creating unit, a data flow graph that has described therein the flow of data concerning an arbitrary register to be verified, the extracting the path includes extracting, from the data flow graph extracted at the extracting the data flow graph, a path indicating the flow of data concerning the arbitrary register to be verified, the identifying includes identifying, based on the data flow graph, the state transition of the path extracted at the extracting the path, the determining includes determining whether the state transition identified at the identifying is set in the DIRW matrix, and the calculating includes calculating a parameter that can be substituted in the arbitrary register to be verified, by using, as a path to be verified of the arbitrary register, the path for which the state transition is determined at the determining to be set in the DIRW matrix, the calculating further being based on the verification scenario acquired at the acquiring and the control data flow graph.

5. The non-transitory computer-readable recording medium according to claim 1 and storing therein the verification supporting program that further causes a computer to execute:

extracting, as an implementation-dependent register that is mounted depending on configuration of the implementation, a register that is among registers described in the control data flow graph and not included in the register list acquired at the acquiring, wherein the extracting the data flow graph includes extracting a data flow graph that has described therein the implementation-dependent register extracted at the extracting the register, the extracting the path includes extracting a path indicating the flow of data concerning the implementation-dependent register, and the calculating includes calculating, if at the determining, the state transition of the path has been determined to be set in the DIRW matrix, a value that can be substituted as a parameter in the implementation-dependent register connected to the path, the verification scenario acquired at the acquiring and the control data flow graph being used in the calculating.

6. The non-transitory computer-readable recording medium according to claim 5, wherein the creating the control data flow graph includes creating, from the implementation information and the register list, the control data flow graph of the circuit to be verified, if at the acquiring, a verification scenario verifying a limited scope in the circuit, the implementation information, and the register list are acquired, and the calculating includes calculating the parameter using the verification scenario for which the scope to be verified is limited and the control data flow graph.

7. The non-transitory computer-readable recording medium according to claim 5, wherein the extracting the data flow graph includes extracting, from the control data flow graph created at the creating unit, a data flow graph that has described therein the flow of data concerning an arbitrary register to be verified, the extracting the path includes extracting, from the data flow graph extracted at the extracting the data flow graph, a path indicating the flow of data concerning the arbitrary register to be verified, the identifying includes identifying, based on the data flow graph, the state transition of the path extracted at the extracting the path, the determining includes determining whether the state transition identified at the identifying is set in the DIRW matrix, and the calculating includes calculating a parameter that can be substituted in the arbitrary register to be verified, by using, as a path to be verified of the arbitrary register, the path for which the state transition is determined at the determining to be set in the DIRW matrix, the calculating further being based on the verification scenario acquired at the acquiring and the control data flow graph.

8. The non-transitory computer-readable recording medium according to claim 5, wherein the extracting the data flow graph includes extracting a data flow graph that has described therein an internal register that is inaccessible from outside the circuit to be verified and the implementation-dependent register extracted at the extracting the register, the extracting the path includes extracting a path indicating the flow of data concerning the internal register and the implementation-dependent register, and the calculating includes calculating, if at the determining, the state transition of the path has been determined to be set in the DIRW matrix, a value that can be substituted as a parameter in the internal register or as a parameter in the implementation-dependent register connected to the path, the verification scenario acquired at the acquiring and the control data flow graph being used in the calculating.

9. A verification supporting apparatus comprising:

a recording unit that records a DIRW matrix in which, among four states including Declare, Initialize, Read, and Write, a state transition that has a possibility of occurring in a register included in a circuit to be verified and information concerning validity of a path corresponding to the state transition are set;

an acquiring unit that acquires implementation information of the circuit to be verified, a verification scenario that is representative of contents of verification for the circuit to be verified, and a register list that indicates attributes of registers included in specifications of the circuit to be verified;

a CDFG creating unit that, from the implementation information and the register list acquired by the acquiring unit, creates a control data flow graph that includes a control flow graph having a flow of control for implementation of the circuit to be verified described therein and further having a data flow graph written therein, the data flow graph having a flow of data in the control flow graph described therein;

a DFG extracting unit that, from the control data flow graph created by the CDFG creating unit, extracts a data flow graph that has described therein a register;

a path extracting unit that, from the data flow graph extracted by the DFG extracting unit, extracts a path indicating the flow of data concerning the register;

an identifying unit that, based on the data flow graph, identifies the state transition of the path extracted by the path extracting unit;

a determining unit that determines whether the state transition identified by the identifying unit is set in the DIRW matrix;

a calculating unit that, if the determining unit has determined that the state transition of the path is set in the DIRW matrix, calculates using the verification scenario acquired by the acquiring unit and the control data flow graph, a value that can be substituted as a parameter in the register connected to the path; and a scenario creating unit that creates a verification scenario having a parameter that is obtained by setting the value calculated at the calculating in the verification scenario.

10. The verification supporting apparatus according to claim 9, wherein
the DFG extracting unit extracts a data flow graph that has described therein an internal register that is inaccessible from outside the circuit to be verified and is among the registers included in the circuit to be verified
the path extracting unit extracts a path indicating the flow of data concerning the internal register, and
the calculating unit, if the determining unit has determined that the state transition of the path is set in the DIRW matrix, calculates using the verification scenario acquired by the acquiring unit and the control data flow graph, a value that can be substituted as a parameter in the internal register connected to the path.

11. The verification supporting apparatus according to claim 9 further comprising:
a register extracting unit that extracts, as an implementation-dependent register that is mounted depending on configuration of the implementation, a register that is among registers described in the control data flow graph and not included in the register list acquired by the acquiring unit, wherein
the DFG extracting unit extracts a data flow graph that has described therein the implementation-dependent register extracted by the register extracting unit,
the path extracting unit extracts a path indicating the flow of data concerning the implementation-dependent register, and
the calculating unit, if the determining unit has determined that the state transition of the path is set in the DIRW matrix, calculates using the verification scenario acquired by the acquiring unit and the control data flow graph, a value that can be substituted as a parameter in the implementation-dependent register connected to the path.

12. The verification supporting apparatus according to claim 11, wherein
the DFG extracting unit extracts a data flow graph that has described therein an internal register that is inaccessible from outside the circuit to be verified and the implementation-dependent register extracted by the register extracting unit,
the path extracting unit extracts a path indicating the flow of data concerning the internal register and the implementation-dependent register, and
the calculating unit, if the determining unit has determined that the state transition of the path is set in the DIRW matrix, calculates using the verification scenario acquired by the acquiring unit and the control data flow graph, a value that can be substituted as a parameter in the internal register or as a parameter in the implementation-dependent register connected to the path.

* * * * *